(12) United States Patent
Chang et al.

(10) Patent No.: US 12,099,093 B2
(45) Date of Patent: Sep. 24, 2024

(54) METHOD FOR MODIFYING GAS DENSITY RELAY, AND GAS DENSITY RELAY HAVING ONLINE SELF-CHECKING FUNCTION AND CHECKING METHOD THEREFOR

(71) Applicant: SHANGHAI ROYE ELECTRIC CO., LTD., Shanghai (CN)

(72) Inventors: Min Chang, Shanghai (CN); Xiaobeng Huang, Shanghai (CN); Tiexin Xia, Shanghai (CN); Zhengcao Guo, Shanghai (CN); Wei Zheng, Shanghai (CN); Haiyong Jing, Shanghai (CN)

(73) Assignee: SHANGHAI ROYE ELECTRIC CO., LTD., Shanghai (CN)

( * ) Notice: Subject to any disclaimer, the term of this patent is extended or adjusted under 35 U.S.C. 154(b) by 338 days.

(21) Appl. No.: 17/776,219

(22) PCT Filed: Dec. 9, 2020

(86) PCT No.: PCT/CN2020/134703
§ 371 (c)(1),
(2) Date: May 11, 2022

(87) PCT Pub. No.: WO2021/115289
PCT Pub. Date: Jun. 17, 2021

(65) Prior Publication Data
US 2022/0390518 A1    Dec. 8, 2022

(30) Foreign Application Priority Data

Dec. 11, 2019 (CN) .......................... 201911263996.4
Dec. 11, 2019 (CN) .......................... 201911263998.3

(51) Int. Cl.
*G01R 31/327* (2006.01)
*G01D 21/02* (2006.01)
(Continued)

(52) U.S. Cl.
CPC ......... *G01R 31/3274* (2013.01); *G01D 21/02* (2013.01); *G01N 9/266* (2013.01); *H01H 35/28* (2013.01)

(58) Field of Classification Search
CPC ............ G01R 31/3274; G01R 31/3275; G01D 21/02; G01N 9/266; H01H 35/28; H01H 33/563
(Continued)

(56) References Cited

U.S. PATENT DOCUMENTS

| 3,390,241 A | 6/1968 | Frowein |
| 2014/0130575 A1 | 5/2014 | Webber et al. |

(Continued)

FOREIGN PATENT DOCUMENTS

| CN | 2637872 Y | 9/2004 |
| CN | 101206169 A | 6/2008 |

(Continued)

OTHER PUBLICATIONS

Zhou, Qiyi et al., "Development of an Assembly Joint for Calibration on SF6 Gas Density Monitor," High Voltage Apparatus, vol. 51, No. 10 (Oct. 16, 2015).

*Primary Examiner* — Giovanni Astacio-Oquendo
(74) *Attorney, Agent, or Firm* — Hsuanyeh Law Group, PC

(57) ABSTRACT

The present disclosure provides a method for modifying a gas density relay and a gas density relay having an online self-check function and a check method therefor. The gas density relay having an online self-check function is used for high-voltage and medium-voltage electrical devices, and includes a gas density relay body, a gas density detection sensor, a gas path blocking pressure regulation mechanism, an online check contact signal sampling unit and an intelligent control unit. The intelligent control unit controls a (Continued)

blocking member of the gas path blocking pressure regulation mechanism to move, so as to block a gas path between a first interface and a second interface. Moreover, a volume of a sealed cavity changes, a gas pressure of the gas density relay body slowly falls, thereby generating contact action, the contact action is transmitted to the intelligent control unit by means of the online check contact signal sampling unit, and the intelligent control unit detects an alarm and/or blocking contact signal action value and/or return value according to a density value during the contact action, such that check can be completed without maintenance personnel on site, and the reliability and efficiency of a power grid are greatly improved while cost is lowered.

20 Claims, 7 Drawing Sheets

(51) Int. Cl.
*G01N 9/26* (2006.01)
*H01H 35/28* (2006.01)

(58) Field of Classification Search
USPC .......................................... 324/419, 418, 415
See application file for complete search history.

(56) References Cited

U.S. PATENT DOCUMENTS

| | | | | |
|---|---|---|---|---|
| 2022/0336172 | A1* | 10/2022 | Jin | .......................... H01H 35/26 |
| 2022/0341993 | A1* | 10/2022 | Xia | .......................... H01H 35/26 |
| 2023/0168302 | A1* | 6/2023 | Huang | ............... G01R 31/3275 |
| | | | | 324/415 |

FOREIGN PATENT DOCUMENTS

| | | |
|---|---|---|
| CN | 208311751 U | 1/2019 |
| CN | 109752649 A | 5/2019 |
| CN | 110487670 A | 11/2019 |
| CN | 110514995 A | 11/2019 |
| CN | 110514996 A | 11/2019 |
| CN | 110542852 A | 12/2019 |
| CN | 110907815 A | 3/2020 |
| CN | 110954816 A | 4/2020 |
| CN | 110988667 A | 4/2020 |
| CN | 111029211 A | 4/2020 |
| CN | 212364519 U | 1/2021 |

\* cited by examiner

METHOD FOR MODIFYING GAS DENSITY RELAY, AND GAS DENSITY RELAY HAVING ONLINE SELF-CHECKING FUNCTION AND CHECKING METHOD THEREFOR

CROSS-REFERENCE TO RELATED APPLICATIONS

The present disclosure claims the priority to the following patent applications:

1, application No. being 201911263996.4 (title of invention: Gas Density Relay having Online Self-Check Function and Check Method therefor) filed on Dec. 11, 2019; and 2, application No. being 201911263998.3 (title of invention: Method for Modifying Gas Density Relay) filed on Dec. 11, 2019.

TECHNICAL FIELD

The present disclosure relates to the technical field of electric power, in particular to a gas density relay having an online self-check function applied to high-voltage and medium-voltage electrical device and a check method therefor, as well as a method for modifying the gas density relay.

BACKGROUND

At present, wide applying of sulfur hexafluoride (SF6) electrical device to electric power departments and industrial and mining enterprises promotes rapid development of electric power industry. In recent years, with rapid economic development, installed capacity of an electric power system in China has expanded rapidly, and the use quantity of the SF6 electrical device has been increasing. The SF6 gas acts like arc extinguishing and insulation in the high-voltage electrical device. If the density of the SF6 gas in the high-voltage electrical device decreases and a micro-water content exceeds standards, safe operation of the SF6 high-voltage electrical device may be seriously affected. Specifically, density decrease of the SF6 gas to a certain extent will lead to failures of insulation and arc extinguishing. With participation of some kinds of metal, the SF6 gas can hydrolyze with water at 200° C. or above to generate active HF and SOF2, which corrodes insulators and metal members, and a large amount of heat is further produced to increase pressure of the air chamber accordingly. When the temperature drops, too much moisture may form condensation, which significantly reduces the surface insulation strength of the insulators, and even causes flashovers and serious harm. Therefore, as mandatorily required by regulations of power grid operation, the density and the water content of the SF6 gas must be regularly tested before the device is put into operation and in operation.

As an unattended substation develops towards networking and digitalization and the requirements for remote control and telemetry are increasingly strengthened, online monitoring of the gas density and the micro-water content of the SF6 electrical device has important practical significance. As smart power grids has developed constantly in China, the smart high-voltage electrical device, as an important component and a key node of the smart substation, plays a prominent role in security of the smart power grids. Most of the high-voltage electrical device are SF6 gas insulated devices at present. Decrease (due to leakage, etc. for example) of the gas density will seriously affect electrical performance of the device and cause serious hidden dangers to safe operation. It is very common to online monitor a gas density value in the SF6 high-voltage electrical device currently. Therefore, the application of a gas density monitoring system (the gas density relay) will flourish. However, the existing gas density monitoring system (the gas density relay) basically uses a gas density transmitter for collecting and uploading the density, the pressure and the temperature, and achieving online monitoring the gas density; and uses a gas density transmitter for collecting and uploading the density, the pressure and the temperature, and achieving online monitoring the gas density. The SF6 gas density relay is the core and key component. However, the remote SF6 gas density relay in a gas density monitoring system (the gas density relay) currently used is composed of a mechanical density relay and an electronic remote transmission portion because of harsh on-site operation environment of a high-voltage substation, especially strong electromagnetic interference. In addition, a traditional mechanical density relay is still used in a power grid system with the gas density transmitter, has one group, two groups or three groups of mechanical contacts, and transmits, when the pressure reaches an alarm, blocking or overpressure state, information to a target device terminal by means of a contact connecting circuit in time, so as to guarantee safe operation of the device. In addition, the monitoring system is further equipped with a safe and reliable circuit transmission function, which establishes an effective platform for real-time data remote reading and information monitoring, and can timely transmit information such as the pressure, the temperature and the density to the target device (such as a computer terminal in general) to achieve online monitoring.

Periodic inspection of the gas density relay on the electrical device is a necessary preventive measure to guarantee the safe and reliable operation of the electrical device, which is also required by "Preventive Test Codes for Electric Power Equipment" and "Twenty-five Key Requirements for Preventing Severe Accidents during Power Generation". From the view of actual operation, periodic check on the gas density relay is one of necessary means to guarantee the safe and reliable operation of a power device. Therefore, at present, check on the gas density relay has been highly valued and popularized in the power system, and has been implemented by all power supply companies, power plants and large industrial and mining enterprises that require testers, device vehicles and high-value SF6 gas for completing on-site check and testing of the gas density relay. With operating loss due to power failure during testing included, it is roughly computed that annual testing cost of each high-voltage switching station is about tens of thousands to hundreds of thousands yuan. In addition, there are still potential safety hazards unless the testers operate in a standardized way. As a result, it is very necessary to innovate on the basis of the existing gas density self-check gas density relay, in particular a gas density online self-check gas density relay or system, a gas density relay or a monitoring system composed thereof that achieves online monitoring of the gas density also has a check function of the gas density relay, so as to complete periodic check on the (mechanical) gas density relay. In this way, no testers are required to work on site, which greatly improves operation efficiency and lowers the cost.

SUMMARY

An objective of the present disclosure is to provide a method for modifying a gas density relay, a gas density relay having an online self-check function and a check method therefor, in order to solve the problems raised in the background art.

In order to achieve the above objective, the present disclosure uses the following technical solution:

A first aspect of the present disclosure provides the gas density relay (or a gas density monitoring device) having an online self-check function. The gas density relay having an online self-check function includes a gas density relay body, a gas density detection sensor, a gas path blocking pressure regulation mechanism, an online check contact signal sampling unit and an intelligent control unit; where the gas density detection sensor is in communication with the gas density relay body;

a gas path of the gas density relay body is connected to a first interface of the gas path blocking pressure regulation mechanism;

the gas path blocking pressure regulation mechanism is further provided with a second interface in communication with electrical device, and the gas path blocking pressure regulation mechanism is configured to block a gas path between the first interface and the second interface, and to regulate a pressure rise and fall of the gas density relay body, thereby generating contact signal action of the gas density relay body;

the online check contact signal sampling unit is directly or indirectly connected to the gas density relay body and is configured to sample a contact signal of the gas density relay body; and the intelligent control unit is separately connected to the gas density detection sensor, the gas path blocking pressure regulation mechanism and the online check contact signal sampling unit, and is configured to control the gas path blocking pressure regulation mechanism, collect a pressure value and a temperature value, and/or collect a gas density value, and detect a contact signal action value and/or a contact signal return value of the gas density relay body;

where the contact signal includes an alarm signal and/or a blocking signal.

Preferably, the gas density detection sensor, the online check contact signal sampling unit and the intelligent control unit are arranged on the gas density relay body; alternatively, the gas density detection sensor, the online check contact signal sampling unit and the intelligent control unit are arranged on the gas path blocking pressure regulation mechanism, and the gas path blocking pressure regulation mechanism is arranged on the gas density relay body; alternatively, the gas density detection sensor, the gas path blocking pressure regulation mechanism, the online check contact signal sampling unit and the intelligent control unit are arranged on the gas density relay body; alternatively, the gas density detection sensor is arranged on the gas density relay body; alternatively, the gas density detection sensor is arranged on the gas path blocking pressure regulation mechanism; alternatively, the gas density relay body is arranged on the gas path blocking pressure regulation mechanism; alternatively, the online check contact signal sampling unit and the intelligent control unit are arranged on the gas path blocking pressure regulation mechanism.

Preferably, the gas density relay body and the gas density detection sensor are in an integrated structure.

More preferably, the gas density relay body and the gas density detection sensor are a remote gas density relay in an integrated structure.

Preferably, the gas density detection sensor is in an integrated structure.

More preferably, the gas density detection sensor is a gas density transmitter in an integrated structure.

Further, the online check contact signal sampling unit and the intelligent control unit are arranged on the gas density transmitter.

Preferably, the online check contact signal sampling unit and the intelligent control unit are arranged together; and preferably, the online check contact signal sampling unit and the intelligent control unit are sealed in a cavity or housing.

Preferably, the gas density detection sensor includes at least one pressure sensor and at least one temperature sensor, alternatively, the gas density detection sensor uses a gas density transmitter composed of a pressure sensor and a temperature sensor; and alternatively, the gas density detection sensor is a density detection sensor using quartz tuning fork technology.

More preferably, the pressure sensor is mounted on the gas path of the gas density relay body or the gas path blocking pressure regulation mechanism, and the temperature sensor is mounted on or outside the gas path of the gas density relay body, or in the gas density relay body, or outside the gas density relay body.

Preferably, the intelligent control unit acquires the gas density value collected by the gas density detection sensor; alternatively, the intelligent control unit acquires the pressure value and temperature value collected by the gas density detection sensor, and completes online monitoring of the gas density relay body by the gas density relay, that is, completes the online monitoring of the gas density of the monitored electrical device by the gas density relay.

More preferably, the intelligent control unit computers the gas density value by an averaging method (a mean value method). According to the average method, in a set time interval, a collection frequency is set, and all N gas density values collected at different time points are subjected to average computing processing, so as to acquire the gas density values; alternatively, in a set time interval, a temperature interval step is set, and density values corresponding to N different temperature values collected in all temperature ranges are subjected to average computing processing, to acquire the gas density value; alternatively, in a set time interval, a pressure interval step is set, density values corresponding to N different pressure values collected in all pressure variation ranges are subjected to average computing processing, to acquire the gas density value; where N is a positive integer greater than or equal to 1.

Preferably, the intelligent control unit acquires a gas density value, during contact signal action or switching of the gas density relay body, collected by the gas density detection sensor, and completes online check on the gas density relay (or the gas density monitoring device); alternatively, the intelligent control unit acquires a pressure value and a temperature value, during contact signal action or switching of the gas density relay body, collected by the gas density detection sensor, and converts the pressure value and the temperature value into a corresponding pressure value at 20° C. according to a gas pressure-temperature feature, that is, the gas density value, so as to complete online check on the gas density relay (or the gas density monitoring device).

Preferably, the gas density relay body is provided with a comparison density value output signal, and the comparison density value output signal is connected to the intelligent control unit; and alternatively, the gas density relay body is configured with a comparison pressure value output signal, and the comparison pressure value output signal is connected to the intelligent control unit.

Preferably, the gas path blocking pressure regulation mechanism includes a sealed cavity and a blocking member in the sealed cavity, the first interface and the second interface are both provided on a wall of the sealed cavity and are in communication with an internal space of the sealed cavity, the blocking member is configured to block the gas path between the first interface and the second interface, and to regulate the pressure rise and fall of the gas density relay body, thereby generating the contact signal action of the gas density relay body.

More preferably, the gas path blocking pressure regulation mechanism further includes a connector and a drive part, and the blocking member is connected to the drive part by means of the connector; alternatively, the blocking member and the connector are designed integrally and directly connected to the drive part; alternatively, the blocking member is associated with the drive part by means of magnetic coupling; and, preferably, the drive part includes one or more of a magnetic drive mechanism, an electric motor, a reciprocating mechanism, a Carnot cycle mechanism, an air compressor, a compressor, a deflation valve, a pressure pump, a booster pump, a booster valve, an electrical gas pump, an electromagnetic gas pump, a pneumatic element, a magnetic coupling thrust mechanism, a heating-based thrust mechanism, an electric heating-based thrust mechanism and a chemical reaction-based thrust mechanism.

Further, one end of the sealed cavity is provided with a fifth interface, one end of the connector is connected to the blocking member, and the other end of the connector passes through the fifth interface to be connected to the drive part.

More further, the first interface is closer to the fifth interface than the second interface, alternatively, the first interface is farther away from the fifth interface than the second interface.

More further, the gas path blocking pressure regulation mechanism further includes a seal connector, the seal connector is arranged at the fifth interface of the sealed cavity, and the other end of the connector passes through the seal connector to be connected to the drive part; preferably, the seal connector includes, but is not limited to one of a bellows, an airbag and a seal ring.

One end of the sealing connector is hermetically connected to the fifth interface, and the other end of the sealing connector is hermetically connected to the drive end of the drive part, or the other end of the sealing connector is hermetically wrapped around the drive part in the sealing connector.

Further, the sealed cavity is a retractable cavity, the drive part is located in the sealed cavity and is provided with drive ends in two directions, connectors include a first connector and a second connector which are connected to the drive ends in two directions respectively, the other end of the first connector is connected to an inner wall of the sealed cavity, the other end of the second connector is connected to the blocking member, the blocking member is provided with a via hole for communication between an interior of the sealed cavity and the second interface, and one side, facing the second interface, of the blocking member is provided with a seal, and the seal is arranged around the via hole.

More further, the seal is two seal rings, and the via hole is located between the two seal rings.

More further, the two drive ends face opposite directions.

More further, the first interface is connected to the gas density relay body by means of a connecting tube (preferably a capillary tube).

More further, the first connector is connected to one end, with the first interface, of the sealed cavity a the direction away from the second connector.

More further, the sealed cavity is provided with a fixed point which is unchangeable in position, and the drive part is mounted or connected to the fixed point.

Further, during check, the blocking member of the gas path blocking pressure regulation mechanism moves under driving of the drive part, the blocking member blocks the gas path between the first interface and the second interface, and the gas pressure of the sealed cavity changes with the position change of the blocking member, so as to regulate the pressure rise and fall of the gas density relay body, and generate the contact signal action of the gas density relay body.

More preferably, an edge of the blocking member is in sealing contact with an inner wall of the sealed cavity; and preferably, the blocking member includes, but is not limited to, one of a piston and a sealing blocking member.

Preferably, the gas path blocking pressure regulation mechanism is sealed in the cavity or the housing.

Preferably, the online check contact signal sampling unit includes a breaking and sampling element, the breaking and sampling element is controlled by the gas density relay body or the gas path blocking pressure regulation mechanism or the intelligent control unit; in a non-checking state, the online check contact signal sampling unit breaks the circuit, by means of the breaking and sampling element, relative to the contact of the gas density relay body; in a checking state, the online check contact signal sampling unit breaks a contact signal control loop of the gas density relay body by means of the breaking and sampling element, and connects the contact of the gas density relay body to the intelligent control unit, preferably, the breaking and sampling element includes one or more of a stroke switch, a microswitch, a button, a motor-operated switch, a displacement switch, an electromagnetic relay, an optocoupler and a silicon controlled rectifier.

Preferably, the gas density relay (or the gas density monitoring device) further includes a multichannel joint, where the gas density relay body and the gas path blocking pressure regulation mechanism are arranged on the multichannel joint; alternatively, the gas path blocking pressure regulation mechanism is fixed on the multichannel joint; and alternatively, the gas density relay body, the gas density detection sensor and the gas path blocking pressure regulation mechanism are arranged on the multichannel joint.

More preferably, the gas density relay (or the gas density monitoring device) further includes an air admission interface, the air admission interface is provided on the gas path blocking pressure regulation mechanism; alternatively, the air admission interface is provided on the electrical device; alternatively, the air admission interface is provided on the multichannel joint.

Preferably, the gas density relay (or the gas density monitoring device) further includes a valve, and the gas path blocking pressure regulation mechanism is further provided with a third interface; one end of the valve is connected to the third interface of the gas path blocking pressure regulation mechanism, and the other end of the valve is directly or indirectly connected to the electrical device; and the first interface is located between the second interface and the third interface.

More preferably, the valve is an electrically operated valve or a solenoid valve. Preferably, the valve is a permanent magnet solenoid valve.

More preferably, the valve is a piezoelectric valve, a temperature control valve, or a novel valve which is made from intelligent memory material and opened or closed by electric heating.

More preferably, the valve is closed or opened by bending or pinching a hose. More preferably, the valve is sealed in the cavity or the housing.

More preferably, the gas density relay (or the gas density monitoring device) further includes a self-sealing valve mounted between the multichannel joint and the valve; alternatively, the valve is mounted between the multichannel joint and the self-sealing valve.

Preferably, the gas density relay (or the gas density monitoring device) further includes a micro-moisture sensor separately connected to the gas density relay body and the intelligent control unit, and/or a decomposition product sensors separately connected to the gas density relay body and the intelligent control unit.

More preferably, the gas density relay (or the gas density monitoring device) further includes a gas circulation mechanism, the gas circulation mechanism is separately connected to the gas density relay body and the intelligent control unit, and the gas circulation mechanism includes a capillary tube, a sealed chamber and a heating element.

Further, the micro-moisture sensor may be mounted in the sealed chamber, in the capillary tube, in a port of the capillary tube or outside the capillary tube of the gas circulation mechanism.

Preferably, the gas density relay (or the gas density monitoring device) further includes a temperature regulation mechanism, the temperature regulation mechanism is a temperature regulatable regulation mechanism and is configured to regulate the temperature rise and fall of the temperature compensation element of the gas density relay body, and to cooperate with or/and combine with the gas path blocking pressure regulation mechanism to generate contact signal action of the gas density relay body; and the intelligent control unit is connected to the temperature regulation mechanism to control the temperature regulation mechanism.

More preferably, the temperature regulation mechanism is a heating element; alternatively, the temperature regulation mechanism includes a heating element, a heat insulation element, a temperature controller, a temperature detector and a temperature regulation mechanism outer shell; alternatively, the temperature regulation mechanism includes a heating element and a temperature controller; alternatively, the temperature regulation mechanism includes a heating element, a heating power regulator and a temperature controller; alternatively, the temperature regulation mechanism includes a heating element, a refrigeration element, a heating power regulator and a temperature controller; alternatively, the temperature regulation mechanism includes a heating element, a heating power regulator and a thermostatic controller; alternatively, the temperature regulation mechanism includes a heating element, a temperature controller and a temperature detector; alternatively, the temperature regulation mechanism is a heating element, the heating element being arranged near the temperature compensation element of the gas density relay body; alternatively, the temperature regulation mechanism is a miniature thermostat;

at least one heating element is arranged, and the heating element includes one or more of a silicone rubber heater, a resistance wire, an electric heating tape, an electric heating rod, a hot-air blower, an infrared ray heating element and a semiconductor; and the temperature controller is connected to the heating element and is used for controlling heating temperature of the heating element, and the temperature controller includes one or more of a proportional integral derivative (PID) controller, a PID and fuzzy control combined controller, an inverter controller and a programmable logic controller (PLC).

Preferably, at least two gas density relay bodies, at least two gas path blocking pressure regulation mechanisms, at least two online check contact signal sampling units, one intelligent control unit and one gas density detection sensor complete online check by the gas density relay (or the gas density monitoring device); alternatively, at least two gas density relay bodies, at least two gas path blocking pressure regulation mechanisms, at least two online check contact signal sampling units, at least two intelligent control units and one gas density detection sensor complete online check by the gas density relay (or the gas density monitoring device); and alternatively, at least two gas density relay bodies, at least two gas path blocking pressure regulation mechanisms, at least two online check contact signal sampling units, at least two gas density detection sensors and one intelligent control unit complete online check on the gas density relay(or the gas density monitoring device.

Preferably, the gas density detection sensor includes at least one pressure sensor and at least one temperature sensor.

Specifically, the pressure sensors may be an absolute pressure sensor, a relative pressure sensor, or an absolute pressure sensor combining a relative pressure sensor, a diffused silicon pressure sensor, a micro electro mechanical system (MEMS) pressure sensor, a chip pressure sensor, a coil induction pressure sensor (such as a pressure sensor with an induction coil of a Bourdon tube), a resistance pressure sensor (such as a pressure sensor with a slide resistance of a Bourdon tube), an analog pressure sensor or a digital pressure sensor; and the temperature sensor may be in the form of a thermocouple, a thermistor and a semiconductor in a contact and non-contact manner, or a thermal resistor and a thermocouple.

More preferably, the pressure sensor includes a relative pressure sensor and/or an absolute pressure sensor.

Further, when the pressure sensor is the absolute pressure sensor, a check result is a corresponding absolute pressure value at 20° C. when an absolute pressure value is used for expression, a check result is converted into a corresponding relative pressure value at 20° C. when a relative pressure value is used for expression; when the pressure sensor is the relative pressure sensor, a check result is a corresponding relative pressure value at 20° C. when a relative pressure value is used for expression, a check result is converted into a corresponding absolute pressure value at 20° C. when an absolute pressure value is used for expression; and a conversion relationship between the absolute pressure value and the relative pressure value is:

$$P_{absolute\ pressure} = P_{relative\ pressure} + P_{standard\ atmospheric\ pressure}.$$

Preferably, the gas density relay body includes, but is not limited to, a bimetallic strip compensation gas density relay, a gas compensation gas density relay, a bimetallic strip and gas compensation hybrid gas density relay, a completely mechanical gas density relay, a digital gas density relay, a combined mechanical and digital gas density relay, a density delay with pointer display, a digital display type gas density relay, a gas density switch without display or indication, a SF6 gas density relay, a SF6 hybrid gas density relay and a N2 gas density relay.

Preferably, the electrical device includes an SF6 gas electrical device, an SF6 hybrid gas electrical device, an environment-friendly gas electrical device, or other insulating gas electrical devices.

Specifically, the electrical device includes a gas insulated metal-enclosure switchgear (GIS), a gas insulated transmission line (GIL), a plug and switch system (PASS), a circuit breaker, a current transformer, a voltage transformer, a transformer, a cubicle gas insulated switchgear and a ring main unit.

Preferably, the online check contact signal sampling unit samples the contact signal of the gas density relay body according to the following requirements that the online check contact signal sampling unit has at least two group of independent sampling contacts, may automatically check at least two contacts at the same time, and may perform continuous detection without changing contacts or reselecting contacts; where the contact includes, but is not limited to, one of an alarm contact, an alarm contact+a blocking contact, an alarm contact+a blocking 1 contact+a blocking 2 contact, and an alarm contact+a blocking contact+an overpressure contact.

Preferably, a voltage of the online check contact signal sampling unit for testing a action value or a switching value of the contact signal of the gas density relay body is not less than 24 V, that is, during check, a voltage of not less than 24 V is applied between corresponding terminals of the contact signal.

Preferably, the intelligent control unit automatically controls, on the basis of an embedded system embedded algorithm and a control program of a microprocessor, the whole check process, including all peripherals, logic, input and output.

More preferably, the intelligent control unit automatically controls, on the basis of a general-purpose computer, an industrial control computer, an ARM chip, an artificial intelligence (AI) chip, a central processing unit (CPU), a microprogrammed control unit (MCU), a field programmable gate array (FPGA), a programmable logic controller (PLC), an industrial control main board, an embedded master control board, and other embedded algorithms and control programs, the whole check process, including all peripherals, logic, input and output.

Preferably, the intelligent control unit has an electrical interface, and the electrical interface completes storage of test data, and/or export of test data, and/or printing of test data, and/or data communication with an upper computer, and/or input of analog and digital information.

Preferably, the gas density relay (or the gas density monitoring device) supports input of basic information which includes one or more of a factory number, accuracy requirements, rated parameters, manufacturers and operation positions.

Preferably, the intelligent control unit further includes a communication module for achieving remote transmission of the test data and/or the check result.

More preferably, a communication manner of the communication module includes a wire communication or wireless communication manner.

Further, the wire communication manner may include one or more of a RS232 bus, a RS485 bus, a controller area network-bus (CAN-BUS), 4-20 mA, a highway addressable remote transducer (Hart), an inter-integrated circuit (IIC), a serial peripheral interface (SPI), Wire, a coaxial cable, a power line carrier (PLC), and a cable.

Further, the wireless communication manner may include one or more of narrowband-Internet of Things (NB-IOT), 2G/3G/4G/5G, wireless fidelity (WIFI), bluetooth, long range radio (Lora), Lorawan, Zigbee, infrared radio, ultrasonic, an acoustic wave, a satellite, an optical wave, quantum communication and sonar.

Preferably, the intelligent control unit is further provided with a clock, and the clock is configured to periodically set check time of the gas density relay, or record the test time or record event time.

Preferably, the intelligent control unit performs field control and/or background control.

More preferably, the gas density relay (or the gas density monitoring device) completes online check on the gas density relay body according to setting or instructions of the background;

alternatively, according to the set check time of the gas density relay, the online check on the gas density relay body is completed.

Preferably, the gas density relay (or the gas density monitoring device) further includes a display interface for human-computer interaction connected to the intelligent control unit to display the current check data in real time and/or support data input.

Preferably, the gas density relay (or the gas density monitoring device) further includes a camera for monitoring.

Preferably, the gas density relay body includes a housing, and a base, a pressure detector, a temperature compensation element and several signal generators which are arranged in the housing; a first interface of the gas path blocking pressure regulation mechanism is in communication with the base; and the online check contact signal sampling unit is connected to the signal generator.

The signal generator includes a microswitch or a snap-action electric contact, and the gas density relay body outputs a contact signal by means of the signal generator, the pressure detector includes a Bourdon tube or a bellows, and the temperature compensation element uses a temperature compensation sheet or a gas enclosed in the housing.

More preferably, at least one of the temperature sensors is arranged near, on or in the temperature compensation element of the gas density relay body. Preferably, at least one of the temperature sensors is arranged at one end, near the temperature compensation element, of the pressure detector of the gas density relay body.

More preferably, the gas density relay body further includes a display mechanism, the display mechanism includes a movement, a pointer and a dial, where the movement is fixed on the base or in the housing; one end of the temperature compensation element is further connected to the movement by means of a connecting rod or directly connected to the movement; the pointer is mounted on the movement and arranged in front of the dial, and the pointer is combined with the dial to display the gas density value; and/or the display mechanism includes a digital device or a liquid crystal device with indication display.

More preferably, the gas density relay (or the gas density monitoring device) further includes a contact resistance detection unit; the contact resistance detection unit is connected to the contact signal or directly connected to the signal generator; under the control of the online check contact signal sampling unit, the contact signal of the gas density relay body is broken from a control loop thereof, and the contact resistance detection unit may detect a contact resistance of the gas density relay body when the contact signal acts and/or when an instruction to detect the contact resistance of the contact is received.

More preferably, the gas density relay (or the gas density monitoring device) further includes an insulation resistance detection unit; the insulation resistance detection unit is connected to the contact signal or directly connected to the signal generator; under the control of the online check contact signal sampling unit, the contact signal of the gas density relay is broken from a control loop thereof, and the insulation resistance detection unit may detect an insulation resistance of the gas density relay when the contact signal of the gas density relay acts and/or when an instruction to detect the insulation resistance of the contact is received.

In the description above, the gas density relay having an online self-check function generally means that its elements are designed into an integrated structure. The gas density monitoring device generally means that its elements are designed in a split structure and flexibly combined.

A second aspect of the present disclosure provides the check method for the gas density relay. The check method includes:

monitoring, in a normal operation state by the gas density relay (or a gas density monitoring device), a gas density value in an electrical device; where according to the set check time or/and the check instruction and the gas density value, in the case where the gas density relay is allowed to be checked:

the gas density relay (or the gas density monitoring device) controls a gas path blocking pressure regulation mechanism by means of an intelligent control unit, a blocking member of the gas path blocking pressure regulation mechanism moves under the action of a drive part, the blocking member blocks a gas path between a first interface and a second interface, along with movement of the blocking member, a volume of a sealed cavity of the gas path blocking pressure regulation mechanism changes, such that a pressure of a gas density relay body can be regulated and further a gas pressure slowly falls, thereby generating contact action of the gas density relay body, the contact action is transmitted to the intelligent control unit by means of an online check contact signal sampling unit, and the intelligent control unit acquires the gas density value according to a pressure value and a temperature value during the contact action, or directly acquires the gas density value, detects a contact signal action value of the gas density relay body, and completes check on the contact signal action value of the gas density relay body; and the gas density relay controls, after check on all contact signals is completed, the gas path blocking pressure regulation mechanism by means of the intelligent control unit, and the blocking member of the gas path blocking pressure regulation mechanism moves under the action of the drive part, such that the gas path between the first interface and the second interface of the gas path blocking pressure regulation mechanism is connected.

Preferably, the check method for the gas density relay includes:

monitoring, in the normal operation state by the gas density relay (or the gas density monitoring device), the gas density value in an electrical device, and online monitoring, by the gas density relay (or the gas density monitoring device), the gas density value in an electrical device by means of a gas density detection sensor and the intelligent control unit; where according to the set check time or/and the check instruction and the gas density value, in the case where the gas density relay is allowed to be checked:

the gas density relay (or the gas density monitoring device) directly or indirectly regulates the online check contact signal sampling unit to a checking state by means of the intelligent control unit, and in the checking state, the online check contact signal sampling unit blocks a contact signal control loop of the gas density relay body, and connects a contact of the gas density relay body to the intelligent control unit;

the gas density relay (or the gas density monitoring device) controls a gas path blocking pressure regulation mechanism by means of an intelligent control unit, a blocking member of the gas path blocking pressure regulation mechanism moves under the action of a drive part, the blocking member blocks a gas path between a first interface and a second interface, along with movement of the blocking member, a volume of a sealed cavity of the gas path blocking pressure regulation mechanism changes, such that a pressure of a gas density relay body can be regulated, and further a gas pressure slowly falls, thereby generating contact action of the gas density relay body, the contact action is transmitted to the intelligent control unit by means of an online check contact signal sampling unit, and the intelligent control unit acquires the gas density value according to a pressure value and a temperature value during the contact action, or directly acquires the gas density value, detects a contact signal action value of the gas density relay body, and completes check on the contact signal action value of the gas density relay body;

the gas density relay (or the gas density monitoring device) drives, by means of the intelligent control unit, the gas path blocking pressure regulation mechanism to cause the gas pressure to rise slowly, thereby generating contact reset of the gas density relay body, the contact reset is transmitted to the intelligent control unit by means of the online check contact signal sampling unit, and the intelligent control unit acquires the gas density value according to a pressure value and a temperature value during the contact reset, or directly acquires the gas density value, detects a contact signal return value of the gas density relay body, and completes the check on the contact signal return value of the gas density relay body; and the gas density relay (or the gas density monitoring device) controls, after the check on all contact signals is completed, the gas path blocking pressure regulation mechanism by means of the intelligent control unit, the blocking member of the gas path blocking pressure regulation mechanism moves under the action of the drive part, such that the gas path between the first interface and the second interface of the gas path blocking pressure regulation mechanism is connected, the online check contact signal sampling unit is regulated to an operation state, and the contact signal control loop of the gas density relay body is restored to a normal operation state.

Preferably, the check method for the gas density relay includes:

where the gas density relay (or the gas density monitoring device) further includes a temperature regulation mechanism, and the method includes:

monitoring, in a normal operation state by the gas density relay (or the gas density monitoring device), a gas density value in an electrical device, and online monitoring, by the gas density relay (or the gas density monitoring device), the gas density value in an electrical device by means of a gas density detection sensor and the intelligent control unit; where according to set check time or/and a check instruction and the gas density value, in the case where the gas density relay is allowed to be checked:

the gas density relay (or the gas density monitoring device) directly or indirectly regulates the online check contact signal sampling unit to a checking state by means of the intelligent control unit, and in the checking state, the online check contact signal sampling unit blocks a contact signal control loop of the gas density relay body, and connects a contact of the gas density relay body to the intelligent control unit;

the gas density relay (or the gas density monitoring device) controls the gas path blocking pressure regulation mechanism by means of the intelligent control unit, the blocking member of the gas path blocking pressure regulation mechanism moves under the action of the drive part, the blocking member blocks the gas path between the first interface and the second interface, along with movement of the blocking member, the volume of the sealed cavity of the gas path blocking pressure regulation mechanism changes, such that the pressure of the gas density relay body can be regulated and further a gas pressure slowly falls, the intelligent control unit controls the temperature regulation mechanism, such that a temperature of a temperature compensation element of the gas density relay body rises, thereby generating the contact reset of the gas density relay body, the contact action is transmitted to the intelligent control unit by means of the online check contact signal sampling unit, and the intelligent control unit acquires the gas density value according to the pressure value and the temperature value during the contact action, or directly acquires the gas density value, detects the contact signal action value of the gas density relay body, and completes the check on the contact signal action value of the gas density relay body;

the gas density relay (or the gas density monitoring device) drives, by means of the intelligent control unit, the gas path blocking pressure regulation mechanism to cause the gas pressure to rise slowly, the intelligent control unit controls the temperature regulation mechanism, the temperature of the temperature compensation element of the gas density relay body falls, thereby generating contact reset of the gas density relay body, the contact reset is transmitted to the intelligent control unit by means of the online check contact signal sampling unit, and the intelligent control unit acquires the gas density value according to the pressure value and the temperature value during the contact reset, or directly acquires the gas density value, detects the contact signal return value of the gas density relay body, and completes the check on the contact signal return value of the gas density relay body; and the gas density relay (or the gas density monitoring device) controls, after the check on all contact signals is completed, the gas path blocking pressure regulation mechanism by means of the intelligent control unit, the blocking member of the gas path blocking pressure regulation mechanism moves under the action of the drive part, such that the gas path between the first interface and the second interface of the gas path blocking pressure regulation mechanism is connected, the intelligent control unit turns off a heating element of the temperature regulation mechanism, the online check contact signal sampling unit is regulated to an operation state, and the contact signal control loop of the gas density relay body is restored to a normal operation state.

Preferably, the contact signal includes an alarm signal and/or a blocking signal.

Preferably, the gas density detection sensor includes at least one pressure sensor and at least one temperature sensor, alternatively, the gas density detection sensor is a gas density transmitter composed of a pressure sensor and a temperature sensor; and alternatively, the gas density detection sensor is a density detection sensor using quartz tuning fork technology.

Preferably, after the gas density relay (or the gas density monitoring device) completes check, if there is any abnormality, an alarm may be automatically given, and the abnormality may be uploaded to a remote end, or sent to a designated receiver.

Preferably, the check method further includes: in situ displaying the gas density value and a check results on site or displaying the gas density value and a check result by means of the background.

Preferably, the check method further includes: performing field control and/or background control by the intelligent control unit.

A third aspect of the present disclosure provides the method for modifying the gas density relay. The method includes:

causing a gas density detection sensor to be in communication with a gas density relay body;

connecting a gas path of the gas density relay body to a first interface of a gas path blocking pressure regulation mechanism, where the gas path blocking pressure regulation mechanism is further provided with a second interface in communication with an electrical device, and the gas path blocking pressure regulation mechanism is configured to block a gas path between the first interface and the second interface, and to regulate a pressure rise and fall of the gas density relay body, thereby generating contact signal action of the gas density relay body;

directly or indirectly connecting an online check contact signal sampling unit to the gas density relay body, where the online check contact signal sampling unit is configured to sample a contact signal of the gas density relay body; and connecting an intelligent control unit to the gas density detection sensor, the gas path blocking pressure regulation mechanism and the online check contact signal sampling unit separately, so as to control the gas path blocking pressure regulation mechanism, collect a pressure value and a temperature value, and/or collect a gas density value, and detect a contact signal action value and/or a contact signal return value of the gas density relay body;

where the contact signal includes an alarm signal and/or a blocking signal.

Preferably, the gas density detection sensor, the online check contact signal sampling unit and the intelligent control unit are arranged on the gas density relay body; alternatively, the gas density detection sensor, the online check contact signal sampling unit and the intelligent control unit are arranged on the gas path blocking pressure regulation mechanism, and the gas path blocking pressure regulation mechanism is arranged on the gas density relay body; alternatively, the gas density detection sensor, the gas path blocking pressure regulation mechanism, the online check contact signal sampling unit and the intelligent control unit are arranged on the gas density relay body; alternatively, the gas density detection sensor is arranged on the gas density relay body; alternatively, the gas density detection sensor is arranged on the gas path blocking pressure regulation mechanism; alternatively, the gas density relay body is arranged on the gas path blocking pressure regulation mechanism; alternatively, the online check contact signal sampling unit and the intelligent control unit are arranged on the gas path blocking pressure regulation mechanism.

Preferably, the method for modifying the gas density relay further includes:

arranging the gas density relay body and the gas path blocking pressure regulation mechanism on a multichannel joint; alternatively, fixing the gas path blocking pressure regulation mechanism on a multichannel joint; alternatively, arranging the gas density relay body, the gas density detection sensor and the gas path blocking pressure regulation mechanism on a multichannel joint.

More preferably, the method for modifying the gas density relay further includes: providing an air admission interface on the gas path blocking pressure regulation mechanism; alternatively, providing an air admission interface on the electrical device; alternatively, providing an air admission interface on the multichannel joint.

Preferably, the method for modifying the gas density relay further includes: further providing a third interface on the gas path blocking pressure regulation mechanism, connecting one end of a valve to the third interface of the gas path blocking pressure regulation mechanism, and directly or indirectly connecting the other end of the valve to an electrical device; where the first interface is located between the second interface and the third interface.

More preferably, the method for modifying the gas density relay further includes: mounting a self-sealing valve between the multichannel joint and the valve; alternatively, mounting the valve between the multichannel joint and the self-sealing valve.

Preferably, the method for modifying the gas density relay further includes: arranging a temperature regulation mechanism inside or outside of a housing of the gas density relay body, where the temperature regulation mechanism is a temperature regulatable regulation mechanism and is configured to regulate a temperature rise and fall of a temperature compensation element of the gas density relay body, and to cooperate with or/and combine with the gas path blocking pressure regulation mechanism to generate contact signal action of the gas density relay body; and the intelligent control unit is connected to the temperature regulation mechanism to control the temperature regulation mechanism.

Preferably, the method for modifying the gas density relay further includes: connecting at least two gas density relay bodies, at least two gas path blocking pressure regulation mechanisms, at least two online check contact signal sampling units, one intelligent control unit and one gas density detection sensor together, so as to complete online check by the gas density relay; alternatively, connecting at least two gas density relay bodies, at least two gas path blocking pressure regulation mechanisms, at least two online check contact signal sampling units, at least two intelligent control units and one gas density detection sensor together, so as to complete online check by the gas density relay; alternatively, connecting at least two gas density relay bodies, at least two gas path blocking pressure regulation mechanisms, at least two online check contact signal sampling units, at least two gas density detection sensors and one intelligent control unit together, so as to complete online check by the gas density relay.

Compared with the prior art, the present disclosure has the following beneficial effects:

The present disclosure is used for a high-voltage and medium-voltage electrical device, and includes the gas density relay body, the gas density detection sensor, the gas path blocking pressure regulation mechanism, the online check contact signal sampling unit and the intelligent control unit. The intelligent control unit controls the gas path blocking pressure regulation mechanism, the blocking member of the gas path blocking pressure regulation mechanism moves under the action of the drive part, the blocking member blocks the gas path between the first interface and the second interface, with movement of the blocking member, the volume of the sealed cavity changes, such that the pressure of the gas density relay body may be regulated and further a gas pressure slowly falls or rises, the contact action or reset of the gas density relay body is generated, the contact action or reset is transmitted to the intelligent control unit by means of the online check contact signal sampling unit, the intelligent control unit detects the alarm and/or locking contact signal action value and/or return value of the gas density relay body according to the density value during contact action, such that the check work by the gas density relay may be completed without maintenance personnel on site, the reliability of the power grid is greatly improved, the efficiency is improved, and the cost is lowered.

In addition, the whole check process achieves zero emission of the SF6 gas, meeting the requirements of environmental protection regulations. Especially, an electronic control valve may not be used in the present disclosure, such that the sealing performance is better, the size is smaller, field reconstruction is convenient, the reliability is improved, and application and popularization are facilitated.

BRIEF DESCRIPTION OF DRAWINGS

Accompanying drawings, which constitute a portion of the present disclosure, are used to provide a further understanding of the present disclosure. Schematic embodiments of the present disclosure and descriptions thereof are used to explain the present disclosure, but not constitute an improper limit to the present disclosure. In the accompanying drawings.

DETAILED DESCRIPTION OF THE EMBODIMENTS

In order to make a purpose, a technical solution and effect of the present disclosure clearer and more specific, the present disclosure will be further described in detail blow with reference to the attached drawings and giving examples. It should be understood that particular embodiments are merely used to explain the present disclosure, and are not used to limit the present disclosure.

Embodiment 1

Figure 1:
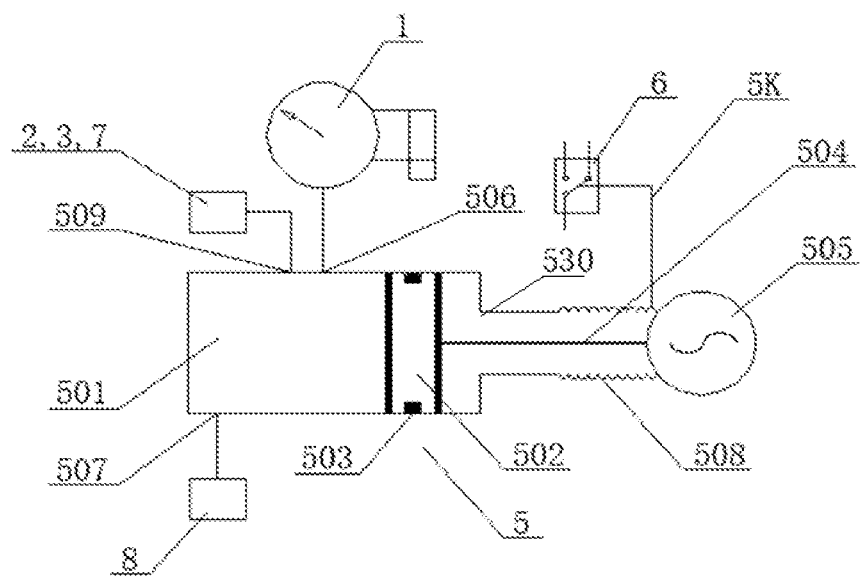
FIG. 1 is a structural schematic diagram of a gas density relay having an online self-check function in an operation state in a first embodiment.

As shown in FIG. 1, a gas density relay (or a gas density monitoring device) having an online self-check function provided in Embodiment 1 of the present disclosure includes a gas density relay body 1, a pressure sensor 2, a temperature sensor 3, a gas path blocking pressure regulation mechanism 5, an online check contact signal sampling unit 6 and an intelligent control unit 7. The gas density relay body 1, the pressure sensor 2, the temperature sensor 3 and the intelligent control unit 7 are arranged on the gas path blocking pressure regulation mechanism 5, and the gas path blocking pressure regulation mechanism 5 is further provided with an interface in communication with a gas path of electrical device 8. FIG. 1 is a schematic diagram of the gas density relay (or the gas density monitoring device) having an online self-check function in an operation state.

Specifically, the gas path blocking pressure regulation mechanism 5 includes a sealed cavity 501, a blocking member 502, a blocking seal 503, a connector 504, a drive part 505, a first interface 506, a second interface 507, a seal connector 508, a fourth interface 509, and a contact signal interlocking piece 5K. The blocking member 502 is arranged in the sealed cavity 501, and the blocking member 502 is connected to the drive part 505 by means of the connector 504 and the seal connector 508. The drive part 505 may include, but is not limited to, one of a magnetic drive mechanism, an electric motor, a reciprocating mechanism, a Carnot cycle mechanism, an air compressor, a compressor, a deflation valve, a pressure pump, a booster pump, a booster valve, an electrical gas pump, an electromagnetic gas pump, a pneumatic element, a magnetic coupling thrust mechanism, a heating-based thrust mechanism, an electric heating-based thrust mechanism and a chemical reaction-based thrust mechanism. The heating-based thrust mechanism, such as a heating bimetallic strip, generates thrust. The drive part 505 is to move the blocking member 502 to close off the gas path of the electrical device 8, such that the gas path between the gas density relay body 1 and the electrical device 8 may be blocked, and in addition, a gas pressure of the gas density relay body 1 may be regulated to rise and fall, such that a contact of the gas density relay body 1 may act or reset. The blocking member 502 is in sealing contact with an inner wall of the sealed cavity 501, and the blocking member 502 includes, but is not limited to, one of a piston and a sealing blocking member. The seal connector 508 and the sealed cavity 501 are arranged together, and the connector 504 is connected to the drive part 505 by means of the seal connector 508. Specifically, one end of the sealed cavity 501 is provided with a fifth interface, the first interface 506 is closer to the fifth interface 530 than the second interface 507, alternatively, the first interface 506 is farther away from the fifth interface 530 than the second interface 507, that is, the blocking member 502 may not block the first interface 506 and the second interface 507 at the same time. The seal connector 508 is arranged at the fifth interface 530 of the sealed cavity 501, one end of the seal connector is hermetically connected to the fifth interface 530, the other end of the seal connector is hermetically connected to a drive end of the drive part 505, alternatively, the other end of the seal connector is hermetically wrapped around the drive part 505 in the seal connector 508. One end of the connector 504 is connected to the blocking member 502, and the other end of the connector passes through the seal connector 508 to be connected to the drive part 505. The seal connector 508 includes, but is not limited to, one of a bellows, an airbag and a seal ring. The first interface 506 and the second interface 507 of the gas path blocking pressure regulation mechanism 5 are staggered in relative position. The second interface 507 of the gas path blocking pressure regulation mechanism 5 is directly or indirectly connected to the electrical device 8, and the first interface 506 of the gas path blocking pressure regulation mechanism 5 is directly or indirectly connected to the gas density relay body 1. The pressure sensor 2 is connected to the fourth interface 509 of the gas path blocking pressure regulation mechanism 5. When in operation, the sealed cavity 501 of the gas path blocking pressure regulation mechanism 5 is in communication with the gas path between the gas density relay body 1 and the electrical device 8. The online check contact signal sampling unit 6 is separately connected to the gas density relay body 1 and the intelligent control unit 7. The pressure sensor 2, the temperature sensor 3 and the gas path blocking pressure regulation mechanism 5 are separately connected to the intelligent control unit 7, and the breaking and sampling element of the online check contact signal sampling unit 6 is arranged opposite the contact signal interlocking member 5K. During check, the contact signal interlocking member 5K may block a contact signal control loop of the gas density relay body 1, thus guaranteeing that a contact action signal of the gas density relay body 1 may not be uploaded during check, and protecting safe operation of a power grid from being affected. The breaking and sampling elements of the online check contact signal sampling unit 6 include one of a one or more of a stroke switch, a microswitch, a button, a motor-operated switch, a displacement switch, an electromagnetic relay and an optocoupler.

The gas density relay body 1 includes a bimetallic strip compensation gas density relay, a gas compensation gas density relay or a bimetallic strip and gas compensation hybrid gas density relay, a completely mechanical gas density relay, a digital gas density relay, a combined mechanical and digital gas density relay, a density relay with an indicator (a density delay with pointer display, a digital display type gas density relay and a liquid crystal display density relay), a density relay without display (a density switch), a SF6 gas density relay, a SF6 hybrid gas density relay, a N2 gas density relay, other gas density relays, etc.

Figure 3:
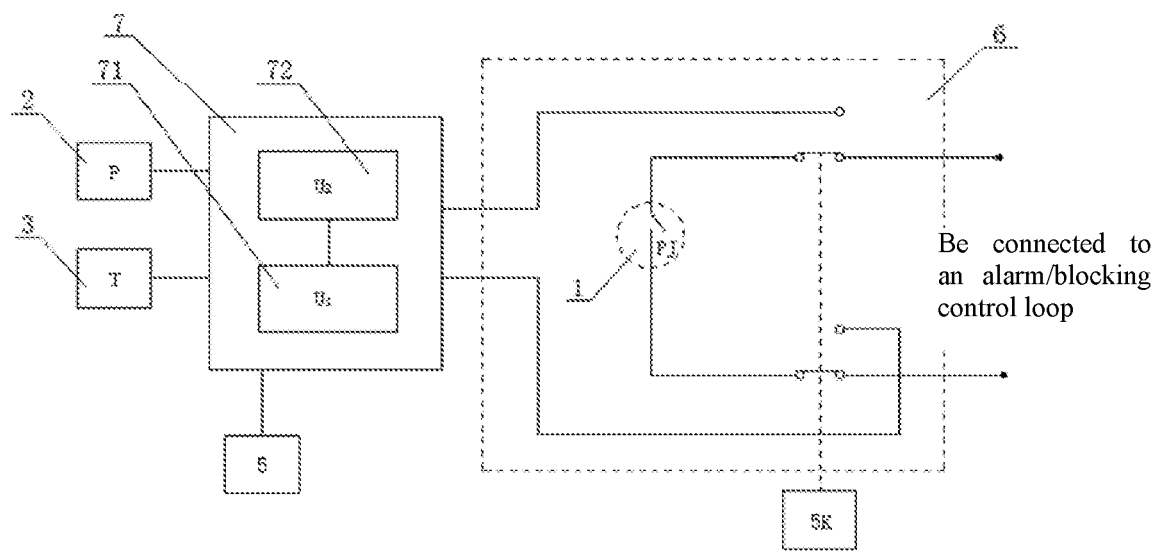
FIG. 3 is a schematic circuit diagram of a gas density relay having an online self-check function in the first embodiment.

As shown in FIG. 3, the intelligent control unit 7 is mainly composed of a processor 71(U1) and a power supply 72(U2). The processor 71(U1) may be a general-purpose computer, an industrial control computer, a central processing unit (CPU), a single chip microcomputer, an ARM chip, an artificial intelligence (AI) chip, a microprogrammed control unit (MCU), a field programmable gate array (FPGA), a programmable logic controller (PLC), an industrial control main board, an embedded master control board, and other intelligent integrated circuits. The power supply 72(U2) may be a switching power supply, an alternating current (AC) 220 V, a direct current (DC) power supply, a low dropout regulator (LDO), a programmable power supply, solar energy, a storage battery, a rechargeable battery, a battery, an electric field induction power supply, a magnetic field induction power supply, a wireless charging power supply, a capacitor power supply, etc.

The pressure sensor 2 may be selected from an absolute pressure sensor, a relative pressure sensor, or an absolute pressure sensor combining a relative pressure sensor, and several pressure sensors may be arranged. The pressure sensor 2 may be in the form of a diffused silicon pressure sensor, a micro electro mechanical system (MEMS) pressure sensor, a chip pressure sensor, a coil induction pressure sensor (such as a pressure measurement sensor with an induction coil of a Bourdon tube), a resistance pressure sensor (such as a pressure measurement sensor with a slide resistance of a Bourdon tube), an analog pressure sensor or a digital pressure sensor. Pressure collection is performed by means of a pressure sensor, a pressure transmitter and other pressure sensing elements, such as a diffused silicon, sapphire, piezoelectric and strain gauge (a resistance strain gauge and a ceramic strain gauge) type.

The temperature sensor 3 may be in the form of a thermocouple, a thermistor and a semiconductor in a contact and non-contact manner, or a thermal resistor and a thermocouple. In short, various temperature sensing elements such as a temperature sensor and a temperature transmitter may be used for temperature collection.

Specifically, the gas path blocking pressure regulation mechanism 5 is mainly composed of the sealed cavity 501, the blocking member 502, the blocking seal 503, the connector 504, the drive part 505, the first interface 506, the second interface 507, the seal connector 508, the fourth interface 509, and the contact signal interlocking piece 5K. The sealing cavity 501 includes the seal connector 508, and the seal connector 508 is composed of the bellows. The blocking member 502 with the blocking seal 503 is arranged in the sealed cavity 501, and the blocking member 502 is connected to the drive part 505 by means of the connector 504 and the seal connector 508. The drive part 505 is composed of the electric motor and the reciprocating mechanism. The blocking member 502 is in sealing contact with the inner wall of the sealed cavity 501 by means of the blocking member seal 503, and the blocking member 502 includes, but is not limited to, one of the piston and the sealing blocking member. Since the seal connector 508 and the sealed cavity 501 are arranged together, the connector 504 is connected to the drive part 505 by means of the seal connector 508, thereby guaranteeing that a whole verification process is sealed.

As shown in FIG. 3, the online check contact signal sampling unit 6 is controlled by means of the contact signal interlocking member 5K, and mainly completes contact signal sampling of the gas density relay body 1. That is, basic requirements or functions of the online check contact signal sampling unit 6 are as follows: 1) the safe operation of the electrical device 8 is not affected during check. That is, during check, when the contact signal of the gas density relay body 1 acts, the safe operation of the electrical device 8 is not affected; and 2) the contact signal control loop of the gas density relay body 1 does not affect performance of the gas density relay, especially the performance of the intelligent control unit 7, and may not damage the gas density relay or affect test work.

A basic requirement or function of the intelligent control unit 7 is to complete control and signal acquisition of the gas path blocking pressure regulation mechanism 5 by means of the intelligent control unit 7. By means of the intelligent control unit 7, the gas path between the first interface 506 and the second interface 507 may be blocked, the gas path between the gas density relay body 1 and the electrical device 8 may be blocked during check, a pressure value and a temperature value during action of the contact signal of the gas density relay body 1 may be detected and converted into a corresponding pressure value $P_{20}$ at (a density value) 20° C., that is, a contact action value $P_{D20}$ of the gas density relay body 1 may be detected, and check on the gas density relay body 1 may be completed. Alternatively, the density value $P_{D20}$ during action of the contact signal of the gas density relay body 1 may be directly detected, so as to complete check on the gas density relay body 1.

It is certain that the intelligent control unit 7 may further complete storage of test data, and/or export of test data, and/or printing of test data, and/or data communication with an upper computer, and/or input of analog and digital information. The intelligent control unit 7 further includes a communication module, and information such as test data and/or check results may be transmitted remotely by means of the communication module. When a rated pressure value of the gas density relay body 1 outputs a signal, the intelligent control unit 7 simultaneously collects a density value upon collection, so as to complete check on the rated pressure value of the gas density relay body 1. Moreover, by means of testing of the rated pressure value of the gas density relay body 1, the self-check work among the gas density relay body 1, the pressure sensor 2 and the temperature sensor 3 may be completed, and maintenance omission is achieved.

The electrical device 8 includes an SF6 gas electrical device, an SF6 hybrid gas electrical device, an environment-friendly gas electrical device, or other insulating gas electrical devices. Specifically, the electrical device 8 includes a gas insulated metal-enclosure switchgear (GIS), a gas insulated transmission line (GIL), a plug and switch system (PASS), a circuit breaker, a current transformer, a voltage transformer, a transformer, a cubicle gas insulated switchgear, a ring main unit, etc.

The gas density relay body 1, the pressure sensor 2, the temperature sensor 3, the gas path blocking pressure regulation mechanism 5, the online check contact signal sampling unit 6, the intelligent control unit 7 and/or a multi-channel joint may be flexibly arranged as required. For example, the gas density relay body 1, the pressure sensor 2 and the temperature sensor 3 may be arranged together. Alternatively, the pressure sensor 2 and the gas path blocking pressure regulation mechanism 5 may be arranged together. In short, the above components may be flexibly arranged and combined. The sealed cavity 501 may be hollowed or partially hollowed, and fits the blocking member 502 in shape, and may regulate gas pressure change by cooperating with the blocking member 502.

Figure 2:
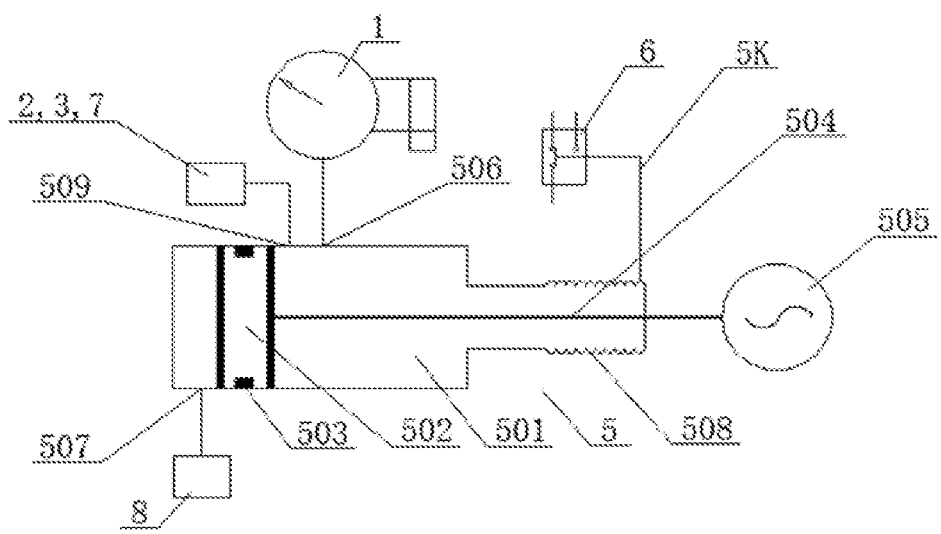
FIG. 2 is a structural schematic diagram of the gas density relay having an online self-check function in an online check state according to the first embodiment.

An operation principle of the gas density relay (or the gas density monitoring device) having an online self-check function is as follows:

the intelligent control unit 7 acquires the corresponding pressure value $P_{20}$ at 20° C. (i.e. the gas density value, an online monitoring gas density value in other words) according to the gas pressure and the gas temperature of the electrical device 8 monitored by the pressure sensor 2 and the temperature sensor 3 respectively. When the gas density relay body 1 needs to be checked, if the gas density value is $P_{20} \geq a$ set safety check density value $P_S$, the gas density relay (or the gas density monitoring device) gives an instruction, that is, the intelligent control unit 7 drives the drive part 505 of the gas path blocking pressure regulation mechanism 5, the drive part 505 drives the connector 504 to move, such that the blocking member 502 and the blocking seal 503 move towards the first interface 506 and the second interface 507, as shown in FIGS. 2 and 3, and during movement, the online check contact signal sampling unit 6 blocks the contact signal control loop of the gas density relay body 1 by means of the contact signal interlocking piece 5K, and connects the contact of the gas density relay body 1 to the intelligent control unit 7. Since the gas density value is monitored to determine whether $P_{20} \geq$ the set safety check density value Ps before start of check on the gas dentisy relay, gas of the electrical device is within a safe operation range, and gas leakage proceeds slowly, such that safety is guaranteed during check. With movement of the blocking member 502 and the blocking seal 503, connection between the first interface 506 and the second interface 507 is blocked under the blocking action of the blocking member 502 and the blocking seal 503. That is, the blocking member 502 and the blocking seal 503 of the gas path blocking pressure regulation mechanism 5 move toward the first interface 506 and the second interface 507 under the action of the drive part 505. After the blocking member 502 passes the first interface 506, the blocking member 502 blocks the gas path between the first interface 506 and the second interface 507, as the blocking member 502 continues moving towards the second interface 507, a volume of the sealed cavity 501 changes, the pressure of the gas density relay body 1 may be regulated and further a gas pressure slowly falls, such that the contact action of the gas density relay body 1 is generated, the contact action is transmitted to the intelligent control unit 7 by means of the online check contact signal sampling unit 6, and the intelligent control unit 7 computers the gas density value $P_{20}$ according to the pressure value P and the temperature value T collected by the pressure sensor 2 and the temperature sensor 3 respectively during the contact action or directly acquires the gas density value $P_{20}$, and detects the contact signal action value $P_{D20}$ of the gas density relay body 1 to complete the check on the contact signal action value of the gas density relay. That is, the intelligent control unit 7 converts the above value into the corresponding pressure value $P_{20}$ (the density value) at 20° C. according to a gas pressure-temperature relationship feature, such that the contact action value $P_{D20}$ of the gas density relay body 1 may be detected. After all contact action values of an alarm signal and/or a blocking signal of the gas density relay body 1 are detected, the blocking member 502 of the gas path blocking pressure regulation mechanism 5 is driven by the intelligent control unit 7 to move towards the first interface 506, the volume of the sealed cavity 501 changes, such that the pressure of the gas density relay body 1 may be regulated to rise slowly, contact reset of the gas density relay body 1 is generated, the contact reset is transmitted to the intelligent control unit 7 by means of the online check contact signal sampling unit 6, and the intelligent control unit 7 acquires the gas density value $P_{20}$ according to a pressure value P and a temperature value T during the contact reset, or directly acquires the gas density value $P_{20}$, detects a contact signal return value $P_{F20}$ of the gas density relay, and completes check on the contact signal return value $P_{F20}$ of the gas density relay. Check may be repeated several times (for example, 2-3 times) according to the process above, and then an average is computed, thereby completing check on the gas density relay body 1.

After the check on all contact signals is completed, the intelligent control unit 7 controls the gas path blocking pressure regulation mechanism 5, and the blocking member 502 of the gas path blocking pressure regulation mechanism 5 moves under the action of the drive part 505, such that the gas path between the first interface 506 and the second interface 507 of the gas path blocking pressure regulation mechanism 5 is connected (as shown in FIG. 1). With the movement of the contact signal interlocking member 5K, the online check contact signal sampling unit 6 is regulated to an operation state, and the contact signal control loop of the gas density relay body 1 is restored to a normal operation state. As shown in FIG. 1, in this case, the gas path between the first interface 506 and the second interface 507 of the gas path blocking pressure regulation mechanism 5 is connected, that is, the gas density relay body 1 is in communication with the electrical device 8 in gas paths, and the gas density relay (or the gas density monitoring device) normally monitors a gas density of an air chamber of the electrical device 8 and may monitor the gas density of the electrical device 8 online. That is, a density monitoring loop of the gas density relay body 1 operates normally, and the gas density relay body 1 safely monitors the gas density of the electrical device 8, such that the electrical device 8 may operate safely and reliably. In this way, online check on the gas density relay body 1 is conveniently completed, and the safe operation of the electrical device 8 may not be affected when the gas density relay body 1 is checked online.

When the gas density relay body 1 completes the check work, the gas density relay (or the gas density monitoring device) may make determination, and display a detection result in a flexible manner. Specifically, 1) the gas density relay may display the result in situ, for example, by means of an indicator light, and digital or liquid crystal display, etc.; 2) the gas density relay may upload the result by means of online remote communication, for example, to background of an online monitoring system; 3) the result may be uploaded to a specific terminal by means of a wireless manner, for example, to a mobile phone; 4) the result may be uploaded by other means; 5) an abnormal result may be uploaded by means of an alarm signal line or a special signal line; and 6) the result may be uploaded separately or combined with other signals. In short, after the gas density relay completes the online check on the gas density relay body 1, if there is any abnormality, an alarm may be automatically given, and the abnormality may be uploaded to a remote end, or sent to a designated receiver, such as a mobile phone. Alternatively, after the gas density relay completes the check on the gas density relay body 1, if there is any abnormality, the intelligent control unit 7 may upload the abnormality by means of an alarm contact signal of the gas density relay body 1 to the remote end (a monitoring room, a background monitoring platform, etc.), and may also display the abnormality in situ. A simple version of the gas density relay online check may upload, during online check, an abnormal check result by means of the alarm signal line, according to, for example, certain rules. For example, in case of abnormality, a contact is connected in parallel to an alarm signal contact, and is regularly closed and disconnected, the condition may be acquired by means of analysis, and alternatively, the abnormality may be uploaded by means of a separate check signal line. Specifically, uploading may be performed in the case of a good condition or a problem, or by means of remote density online monitoring, alternatively, the check result may be uploaded by means of the separate check signal line, alternatively, an alarm may be given in situ by means of in-situ display of the check result, alternatively, the check result may be uploaded by means of a wireless manner or by networking with the smart phone. Communication uses a wire or wireless manner, the wire communication manner may use industrial buses of RS232, RS485, controller area network-bus (CAN-BUS), etc., optical fiber ethernet, 4-20 mA, a highway addressable remote transducer (Hart), an inter-integrated circuit (IIC), an serial peripheral interface (SPI), Wire, a coaxial cable, a power line carrier (PLC), etc. The wireless communication manner may use 2G/3G/4G/5G, wireless fidelity (WIFI), bluetooth, long range radio (Lora), Lorawan, Zigbee, infrared radio, ultrasonic, an acoustic wave, a satellite, an optical wave, quantum communication, sonar, a sensor built-in 5G/NB-IOT communication module (such as narrowband-Internet of Things (NB-IOT)), etc. In short, reliability of the gas density relay may be fully guaranteed in multiple ways and multiple combinations.

The gas density relay has the function of safety protection. Specifically, when a gas density value is lower than the set value, the gas density relay (or the gas density monitoring device) may automatically stop online check on the gas density relay body 1 and send out a display signal. For example, when the gas density value of the device is less than the set value $P_S$, no check is performed. For example, only when the gas density value of the equipment is greater than or equal to (an alarm pressure value+0.02 MPa), may online check be performed.

The gas density relay (or the gas density monitoring device) may be online checked according to set time or a set temperature (such as an extreme high temperature, a high temperature, an extreme low temperature, a low temperature, a normal temperature, 20° C., etc.). Error determination requirements vary for online check at a high temperature, a low temperature, a normal temperature and an ambient temperature of 20° C. For example, in the case of check at an ambient temperature of 20° C., accuracy requirements from the gas density relay may be grade 1.0 or 1.6, and may be grade 2.5 in the case of a high temperature. Specifically, relevant standards may be applied according to the temperature requirements. For example, according to regulations on temperature compensation performance in Article 4.8 of DL/T 259 "Check Regulations of Sulphur Hexafluoride Gas Density Relays", the temperature values have corresponding precision requirements.

The gas density relay (or the gas density monitoring device) may compare its error performance at different temperatures and different time periods. That is, the performance of the gas density relay and the performance of the electrical device may be determined by comparison in different periods and within a same temperature range. The comparison may be performed between various historical periods, and between the history and the present.

The gas density relay (or the gas density monitoring device) may be checked repeatedly for many times (for example, 2-3 times), and the average is computed according to the check result each time. When necessary, the gas density relay may be checked online at any time.

The gas density relay (or the gas density monitoring device) has the functions of pressure and temperature detection and software conversion. On the premise that the safe operation of the electrical device 8 is not affected, the alarm and/or locking contact action value and/or return value of the gas density relay body 1 may be detected online. Of course, the alarm and/or blocking contact signal return value may be free of testing as required. In addition, the gas density relay (or the gas density monitoring device) may further monitor the gas density value, and/or the pressure value and/or the temperature value of the electrical device 8 online, and upload the value to target equipment for online monitoring.

Embodiment 2

Figure 4:
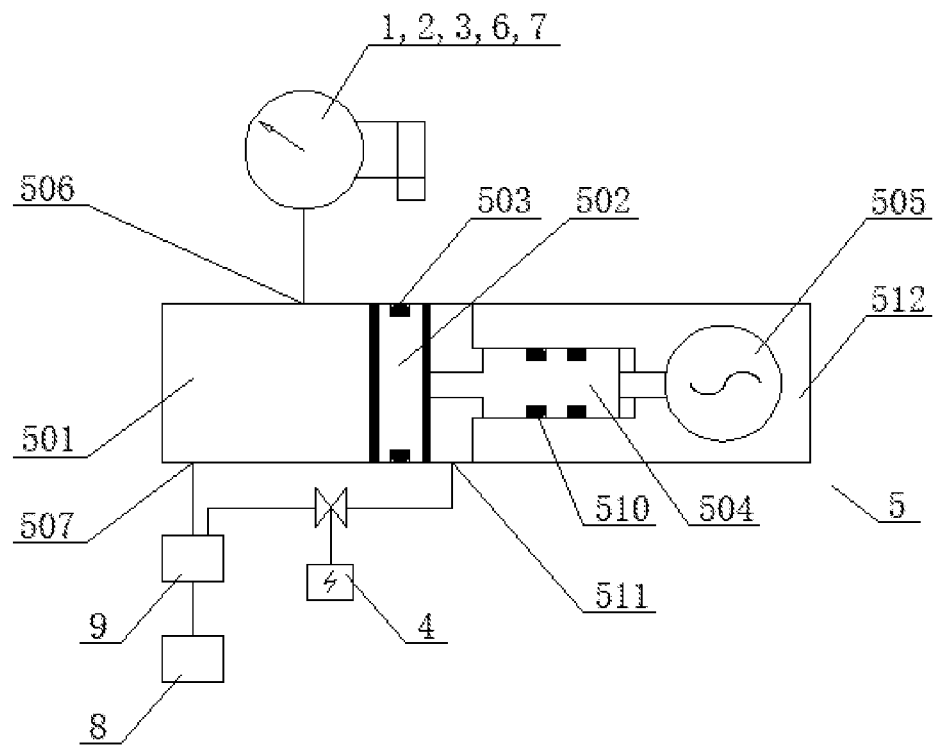
FIG. 4 is a structural schematic diagram of a gas density relay having an online self-check function in Embodiment 2.

As shown in FIG. 4, a gas density relay (or a gas density monitoring device) having an online self-check function provided in Embodiment 2 of the present disclosure includes a gas density relay body 1, a pressure sensor 2, a temperature sensor 3, a valve 4, a gas path blocking pressure regulation mechanism 5, an online check contact signal sampling unit 6, an intelligent control unit 7 and a multichannel joint 9. The pressure sensor 2, the temperature sensor 3, the online check contact signal sampling unit 6 and the intelligent control unit 7 are arranged on the gas density relay body 1, and the gas path blocking pressure regulation mechanism 5 is further provided with an interface in communication with a gas path of an electrical device 8.

FIG. 4 is a schematic diagram of the gas density relay (or the gas density monitoring device) having an online self-check function in an operation. Specifically, the gas path blocking pressure regulation mechanism 5 includes a sealed cavity 501, a blocking member 502, a blocking seal 503, a connector 504, a drive part 505, a first interface 506, a second interface 507, a third interface 511, a connector seal 510, and a cavity (or a housing) 512. One end of the valve 4 is connected to the third interface 511, and the other end of the valve 4 is connected to the multichannel joint 9. The first interface 506 is arranged between the second interface 507 and the third interface 511. The connector 504 is hermetically connected to the sealed cavity 501 by means of the connector seal 510. The blocking member 502 is arranged in the sealed cavity 501, and the blocking member 502 is connected to the drive part 505 by means of the connector 504. The connector 504, the drive part 505 and the connector seal 510 are sealed in a cavity (or a housing) 512. Desirable seal is achieved between the cavity (or the housing) 512 and the sealed cavity 501, that is, the cavity (or the housing) 512 guarantees that the gas path blocking pressure regulation mechanism 5 has desirable sealing performance. The gas density relay body 1 is mounted on the gas path blocking pressure regulation mechanism 5, the gas path blocking pressure regulation mechanism 5 is mounted on the multichannel joint 9, the pressure sensor 2 and the temperature sensor 3 are arranged on the gas density relay body 1, and the pressure sensor 2 is in communication with the gas density relay body 1 in gas paths. When in operation, the gas path blocking pressure regulation mechanism 5 is in communication with the gas density relay body 1, and the online check contact signal sampling unit 6 and the intelligent control unit 7 are arranged together. The pressure sensor 2, the temperature sensor 3, the valve 4 and the gas path blocking pressure regulation mechanism 5 are separately connected to the intelligent control unit 7. The multichannel joint 9 is further in communication with an air admission interface.

The valve 4 may be controlled in various transmission manners, such as manual, electric, hydraulic, pneumatic, turbine, electromagnetic, electromagnetic-hydraulic, electro-hydraulic, pneumatic-hydraulic, spur gear and bevel gear drive. The valve may act according to predetermined requirements under the action of a pressure, a temperature or other forms of sensing signals, or simply opens or closes independent of the sensing signals. The valve 4 makes an opening and closing member move up and down, slip, swing or rotate by means of a drive or automatic mechanism, thus changing an area of a flow channel to achieve a control function thereof. According to a drive manner, the valve 4 may be an automatic valve, a power-driven valve and a manual valve. The automatic valve may include electromagnetic drive, electromagnetic-hydraulic drive, electro-hydraulic drive, turbine drive, spur gear drive, bevel gear drive, pneumatic drive, hydraulic drive, gas-hydraulic drive, electric drive and electric motor drive. The valve 4 may be automatic or manual or semi-automatic. A check process may be completed automatically or in a manual-assisted semi-automatic manner. The valve 4 is directly or indirectly connected to the electrical device 8 by means of a self-sealing valve, a manual valve, or a non-detachable valve, in an integrated or split manner. The valve 4 may be normally open, normally closed, one-way or two-way as required. In a word, the gas path is opened or closed by means of the valve 4, and the valve 4 may be a solenoid valve, an electric ball valve, an electrically operated valve or an electric proportional valve, etc.

Different from the first embodiment, the gas path blocking pressure regulation mechanism 5 in this embodiment is mainly characterized in that the connector 504 is in sealed connection to the sealed cavity 501 by means of the connector seal 510. The connector 504, the drive part 505 and the connector seal 510 are sealed in the cavity (or the housing) 512. Desirable seal is achieved between the cavity (or the housing) 512 and the sealed cavity 501, that is, the cavity (or the housing) 512 guarantees that the gas path blocking pressure regulation mechanism 5 has desirable sealing performance. In addition, the valve 4 is further included in this embodiment, and the gas density relay body 1 with an overpressure alarm contact function is checked by means of the valve 4. As in the first embodiment, after an alarm and/or blocking contact action value and/or return value of the gas density relay body 1 is online detected, the blocking member 502 is regulated (or automatically set) to a suitable position, for example, close to the second interface 507, then the valve 4 is controlled by means of the intelligent control unit 7, that is, the valve 4 is opened by means of the intelligent control unit 7, in this case, gas of the electrical device 8 enters the gas density relay body 1, a pressure of the gas density relay body 1 rises to a set pressure value or directly rises to a gas pressure value of the electrical device 8, and then the intelligent control unit 7 closes the valve 4. Further, the intelligent control unit 7 drives the gas path blocking pressure regulation mechanism 5, and the blocking member 502 moves towards the third interface 511, such that a volume of the sealed cavity 501 (a right portion of the blocking member 502 in FIG. 4) changes, the pressure of the gas density relay body 1 may be regulated to rise slowly, an overpressure alarm contact of the gas density relay body 1 acts, an action signal of the overpressure alarm contact is transmitted to the intelligent control unit 7 by means of the online check contact signal sampling unit 6, the intelligent control unit 7 acquires a gas density value $P_{20}$ according to a pressure value P and a temperature value T during action of the overpressure alarm contact, or directly acquires the gas density value $P_{20}$, detects a contact signal value $P_{C20}$ of the overpressure alarm contact of the gas density relay, and completes check on the overpressure alarm contact signal value $P_{C20}$ of the gas density relay body 1. The intelligent control unit 7 controls the gas path blocking pressure regulation mechanism 5 to make the drive part 505 push the blocking member 502 to move, the volume of the sealed cavity 501 changes, such that the pressure is caused to drop, a reset contact signal value $P_{CF20}$ of the overpressure alarm contact of the gas density relay is detected, and the check on an overpressure alarm contact signal return value $P_{CF20}$ of the gas density relay body 1 is completed.

Embodiment 3

Figure 5:
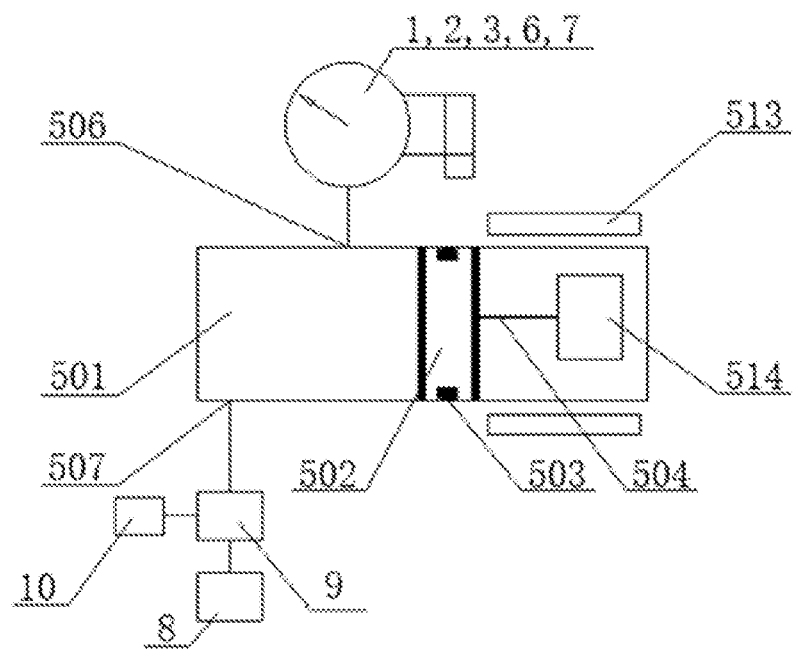
FIG. 5 is a schematic structural diagram of a gas density relay having an online self-check function in Embodiment 3.

As shown in FIG. 5, a gas density relay (or a gas density monitoring device) having an online self-check function provided in Embodiment 3 of the present disclosure includes a gas density relay body 1, a pressure sensor 2, a temperature sensor 3, a gas path blocking pressure regulation mechanism 5, an online check contact signal sampling unit 6, an intelligent control unit 7, a multichannel joint 9 and an air admission interface 10. The gas path blocking pressure regulation mechanism 5 includes a sealed cavity 501, a blocking member 502, a blocking seal 503, a connector 504, drive parts 513, 514, a first interface 506 and a second interface 507. The gas density relay body 1 is mounted on the gas path blocking pressure regulation mechanism 5. The pressure sensor 2, the temperature sensor 3, the online check contact signal sampling unit 6 and the intelligent control unit 7 are arranged together. The gas path blocking pressure regulation mechanism 5 is mounted on the multichannel joint 9, and the pressure sensor 2 is in communication with the gas density relay body 1 on a gas path. The air admission interface 10 is arranged on the multichannel joint 9. The pressure sensor 2, the temperature sensor 3 and the gas path blocking pressure regulation mechanism 5 are separately connected to the intelligent control unit 7.

As a biggest difference from the first embodiment, the drive parts of the gas path blocking pressure regulation mechanism 5 in this embodiment are composed of a power driving part 513 and a driven part 514, and the blocking member 502, the connector 504 and the driven part 514 are arranged inside the sealed cavity 501. The blocking member 502 is connected to the driven part 514 by means of the connector 504. The intelligent control unit 7 controls the power driving part 513 to push the driven part 514 to move, such that the blocking member 502 moves, a volume of the sealed cavity 501 changes and a pressure rises and falls. The power driving part 513 is arranged outside the sealed cavity 501, the driven part 514 is arranged inside the sealed cavity 501, the power driving part 513 applies electromagnetic force to push the driven part 514 to move, that is, the driven part 514 and the blocking member 502 are moved by means of magnetic force between the power driving part 513 and the driven part 514. This embodiment may be implemented by combining a magnetic coupling rodless cylinder.

Embodiment 4

Figure 6:
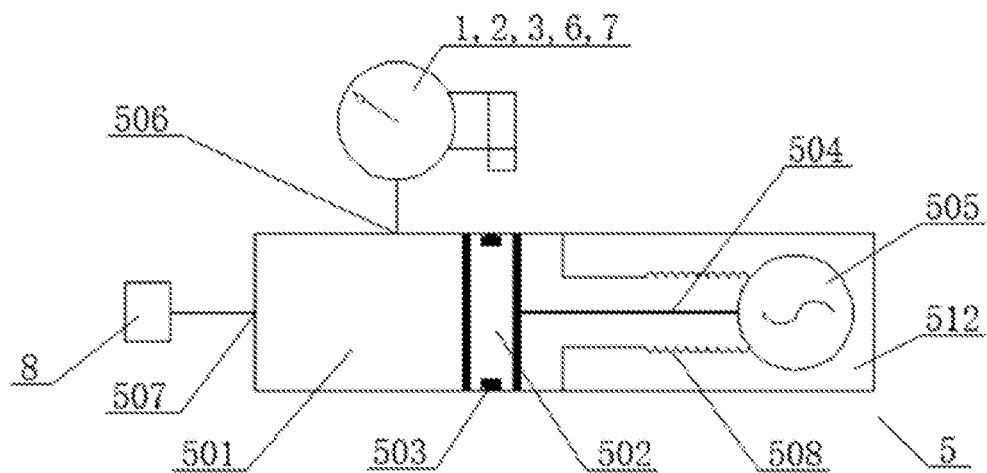
FIG. 6 is a schematic structural diagram of a gas density relay having an online self-check function in Embodiment 4.

As shown in FIG. 6, a gas density relay (or a gas density monitoring device) having an online self-check function provided in Embodiment 4 of the present disclosure includes a gas density relay body 1, a pressure sensor 2, a temperature sensor 3, a gas path blocking pressure regulation mechanism 5, an online check contact signal sampling unit 6 and an intelligent control unit 7. The pressure sensor 2, the temperature sensor 3, the online check contact signal sampling unit 6 and the intelligent control unit 7 are arranged on the gas density relay body 1. The gas density relay body 1 is arranged on the gas path blocking pressure regulation mechanism 5. The gas path blocking pressure regulation mechanism 5 includes a sealed cavity 501, a blocking member 502, a blocking seal 503, a connector 504, a drive part 505, a first interface 506, a second interface 507, a seal connector 508, and a cavity (or a housing) 512. The seal connector 508 may be composed of a bellows. The connector 504, the drive part 505 and the seal connector 508 are hermetically arranged inside the cavity (or the housing) 512. The second interface 507 of the gas path blocking pressure regulation mechanism 5 may be directly or indirectly connected to an electrical device 8 by means of a joint.

Different from Embodiment 1, the connector 504, the drive part 505 and the seal connector 508 in this embodiment are hermetically arranged inside the cavity (or the housing) 512, which further improves sealing performance and ensures safe operation of a power grid. In addition, the blocking member 502 may be directly connected to the drive part 505 by means of the seal connector 508. Alternatively, the blocking member 502 and the connector 504 are integrally designed and the blocking member is directly connected to the drive part 505.

Figure 7:
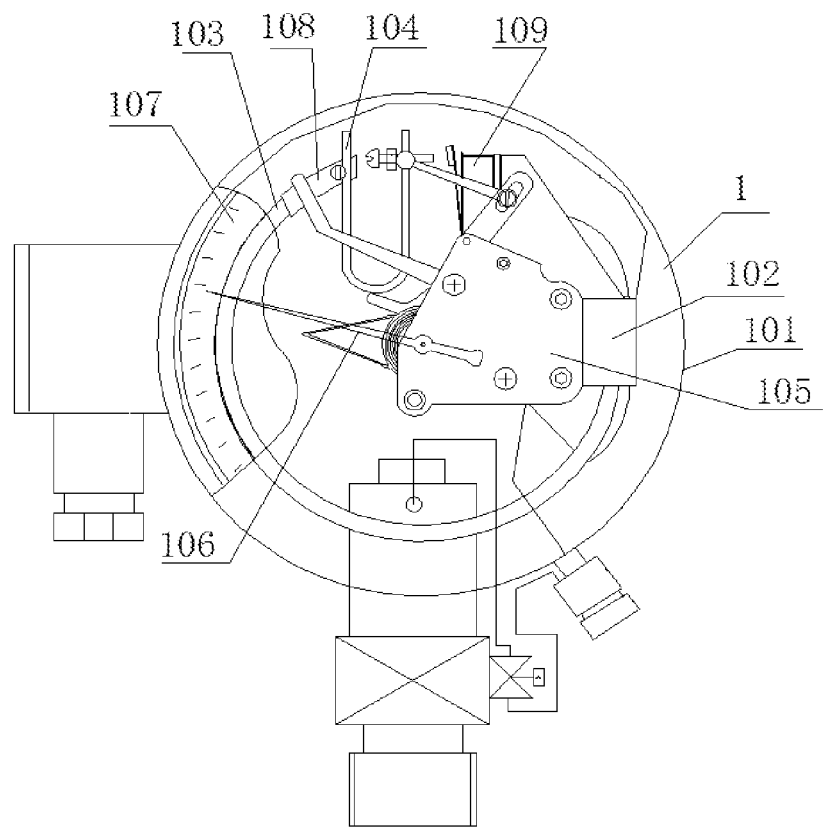
FIG. 7 is a structural schematic diagram of a gas density relay body in a preferred embodiment.

FIG. 7 is a structural schematic diagram of a gas density relay body 1 in a preferred embodiment of the present disclosure. As shown in FIG. 7, the gas density relay body 1 includes a housing 101, and a base 102, a block 108, a pressure detector 103, a temperature compensation element 104, several signal generators 109, a movement 105, a pointer 106 and a dial 107 which are arranged in the housing 101. One end of the pressure detector 103 is fixed on the base 102 in communication with same. The other end of the pressure detector 103 is connected to one end of the temperature compensation element 104 by means of the block 108. The other end of the temperature compensation element 104 is provided with a beam, and the beam is provided with a regulator that pushes the signal generator 109 to make a contact of the signal generator 109 be switched on or off. The movement 105 is fixed on the base 102. The other end of the temperature compensation element 104 is further connected to the movement 105 by means of a connecting rod or is directly connected to the movement 105. The pointer 106 is mounted on the movement 105 and arranged in front of the dial 107. The pointer 106 displays a gas density value in combination with the dial 107. The gas density relay body 1 may further include a digital device or a liquid crystal device with indication display. The signal generator 109 includes a microswitch or a snap-action electric contact, and the gas density relay body 1 outputs a contact signal by means of the signal generator 109. The pressure detector 103 includes a Bourdon tube or a bellows. The temperature compensation element 104 uses a temperature compensation sheet or a gas enclosed in the housing. The gas density relay body 1 in this embodiment may further include an oil-filled density relay, an oil-free density relay, a gas density meter, a gas density switch or a gas pressure gauge.

In the gas density relay body 1 in this embodiment, based on the pressure detector 103 and by utilizing the temperature compensation element 104, a changing pressure and temperature are checked to reflect change of a density of sulfur hexafluoride gas. That is, under the action of the pressure of the detected medium sulfur hexafluoride (SF6) gas, due to an effect of the temperature compensation element 104, when the density value of the sulfur hexafluoride gas greatly changes, the pressure value of the sulfur hexafluoride gas further changes accordingly, forcing corresponding elastic deformation displacement of an end of the pressure detector 103 to be generated, the corresponding elastic deformation displacement is transmitted to the movement 105 by means of the temperature compensation element 104, and then is transmitted by the movement 105 to the pointer 106, such that the detected density value of the sulfur hexafluoride gas is displayed on the dial 107. The signal generator 109 serves as an output alarm blocking contact. In this way, the gas density relay body 1 may display the density value of the sulfur hexafluoride gas. If gas leaks, the density value of the sulfur hexafluoride gas falls, corresponding downward displacement of the pressure detector 103 is generated, the corresponding downward displacement is transmitted to the movement 105 by means of the temperature compensation element 104, and then is transmitted by the movement 105 to the pointer 106, the pointer 106 moves in a direction with indications reducing, and a degree of gas leak is specifically displayed on the dial 107. In this case, the pressure detector 103 drives the beam to move downwards by means of the temperature compensation element 104, the regulator on the beam gradually moves away from the signal generator 109 to an extent to which, the contact of the signal generator 109 is switched on, a corresponding contact signal (alarm or blocking) is given, such that the gas density of the sulfur hexafluoride in an electrical switch and other devices may be monitored and controlled, and the electrical device may work safely.

If the gas density value rises, that is, when the pressure value of the sulfur hexafluoride gas in a sealed air chamber is greater than a set pressure value of the sulfur hexafluoride gas, the pressure value also rises correspondingly, the end of the pressure detector 103 and the temperature compensation element 104 move upwards correspondingly, and the temperature compensation element 104 further moves the beam upwards, such that the regulator on the beam moves upwards and pushes the contact of the signal generator 109 to be disconnected, and the contact signal (alarm or blocking) is released.

Embodiment 5

Figure 8:
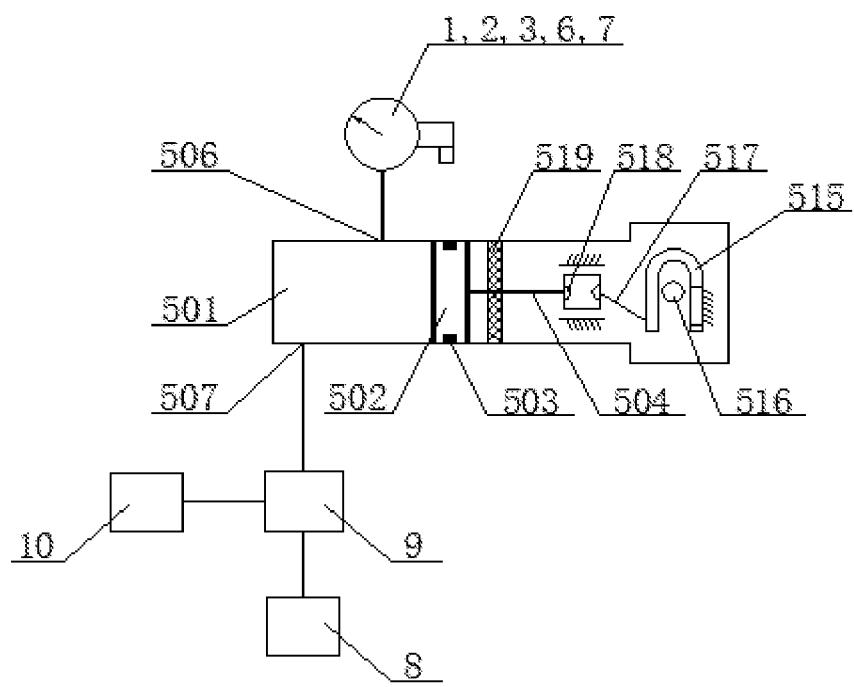
FIG. 8 is a structural schematic diagram of a gas density relay having an online self-check function in Embodiment 5.

As shown in FIG. 8, a gas density relay (or a gas density monitoring device) having an online self-check function provided in Embodiment 5 of the present disclosure includes a gas density relay body 1, a pressure sensor 2, a temperature sensor 3, a gas path blocking pressure regulation mechanism 5, an online check contact signal sampling unit 6 and an intelligent control unit 7. The pressure sensor 2, the temperature sensor 3, the online check contact signal sampling unit 6 and the intelligent control unit 7 are arranged on the gas density relay body 1. The gas density relay body 1 is arranged on the gas path blocking pressure regulation mechanism 5. Further, the gas path blocking pressure regulation mechanism 5 includes a sealed cavity 501, a blocking member 502, a blocking seal 503, a connector 504, a drive part composed of a heating device 516 and a bimetallic strip 515 (i.e., an electrical heating-based thrust mechanism), a first interface 506, a second interface 507, a connector 517, a slider 518, a heat insulating member 519, a cavity (or a housing). The drive part composed of the connector 504, the heating device 516 and the bimetallic strip 515, the connector 517 and the slider 518 are hermetically arranged inside the cavity (or housing). The second interface 507 of the gas path blocking pressure regulation mechanism 5 may be directly or indirectly connected to the electrical device 8 by means of a joint.

Different from the first embodiment, the drive part composed of the connector 504, the heating device 516 and the bimetallic strip 515, the connector 517 and the slider 518 in this embodiment are hermetically arranged inside the cavity (or housing), further improving sealing performance and ensuring safe operation of a power grid. In this embodiment, the drive part composed of the heating device 516 and the bimetallic strip 515. When the heating device 516 is switched on and heated, the bimetallic strip 515 may expand, push the connector 517 and the slider 518 to move, and then push the connector 504 to move, and then push the blocking member 502 to move, so as to block off a gas path and regulate the pressure.

Embodiment 6

Figure 9:
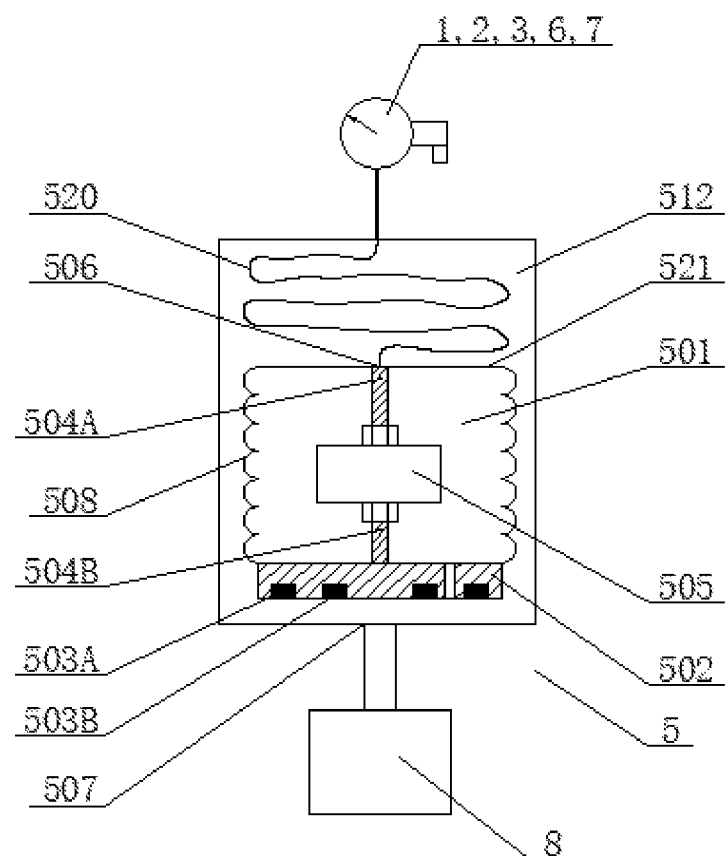
FIG. 9 is a structural schematic diagram of a gas density relay having an online self-check function in Embodiment 6.

As shown in FIG. 9, a gas density relay (or a gas density monitoring device) having an online self-check function provided in Embodiment 6 of the present disclosure includes a gas density relay body 1, a pressure sensor 2, a temperature sensor 3, a gas path blocking pressure regulation mechanism 5, an online check contact signal sampling unit 6 and an intelligent control unit 7. The pressure sensor 2, the temperature sensor 3, the online check contact signal sampling unit 6 and the intelligent control unit 7 are arranged on the gas density relay body 1. The gas density relay body 1 is arranged on the gas path blocking pressure regulation mechanism 5. Further, the gas path blocking pressure regulation mechanism 5 includes a sealed cavity 501, a blocking member 502, a blocking seal 503A, a blocking seal 503B, a connector 504A, a connector 504B, a drive part 505, a first interface 506, a second interface 507, a capillary tube 520, and a cavity (or a housing) 512. The second interface 507 of the gas path blocking pressure regulation mechanism 5 may be directly or indirectly connected to the electrical device 8 by means of a joint. The sealed cavity 501 is composed of a bellows 508, a blocking member 502 and a blocking member 521. The gas density relay body 1 is in communication with the first interface 506 of the gas path blocking pressure regulation mechanism 5 by means of the spiral capillary tube 520 in gas paths. The sealed cavity 501 is further provided with a fixed point (not shown in the figure) unchangable in position, for example, a point where a wall of the sealed cavity 501 is fixedly connected to the outer housing 512, and the drive part 505 may be mounted or connected to the fixed point to prevent position change of the drive part 505.

Different from Embodiment 1, during operation of this embodiment, the intelligent control unit 7 controls the drive part 505, then makes the connector 504B move downwards, then pushes the blocking member 502 to move downwards, and closes a gas path of the second interface 507, such that a gas path between the gas density relay body 1 and the electrical device 8 is blocked, the connector 504A is simultaneously or subsequently caused to move upwards, then the blocking member 521 is pushed to move upwards, such that the bellows 508 is expanded, a volume of the sealed cavity 501 is changed, such that the pressure is regulated to fall or rise, and check on the gas density relay body 1 is completed. In this embodiment, the blocking member 502 may be firstly moved downwards to close the gas path of the second interface 507, then the connector 504A may be made to move upwards to push the blocking member 521 to move upwards, such that the bellows 508 may be expanded, and the volume of the sealed cavity 501 may be changed, and then the pressure may be regulated to fall or rise. Alternatively, the blocking member 502 may be moved downwards to close the gas path of the second interface 507, the connector 504A may be moved upwards, such that the blocking member 521 may be pushed to move upwards, the bellows 508 may be expanded, the volume of its sealed cavity 501 may be changed, and the pressure may be regulated to fall or rise. The blocking member 502 and the blocking member 521 may be made to downwards move and upwards move, the blocking member 502 moves downwards until the gas path of the second interface 507 is closed, and the gas path of the second interface 507 remains closed. However, the blocking member 521 may continue to move upwards, such that the bellows 508 may expand, and the volume of its sealed cavity 501 may change, and then the pressure may be regulated to fall or rise. The drive part 505 may be arranged inside or outside the sealed cavity 501.

Embodiment 7

Figure 10:
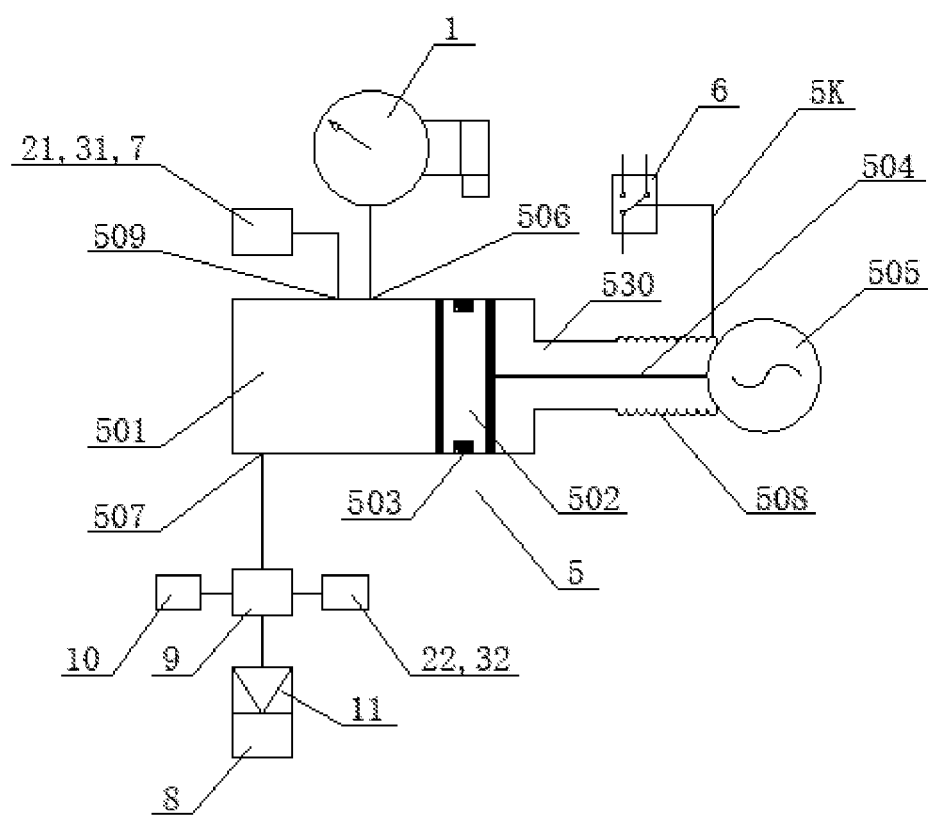
FIG. 10 is a structural schematic diagram of a gas density relay having an online self-check function in Embodiment 7.

As shown in FIG. 10, a gas density relay (or a gas density monitoring device) having an online self-check function provided in Embodiment 7 of the present disclosure includes: a gas density relay body 1, a first pressure sensor 21, a second pressure sensor 22, a first temperature sensor 31, a second temperature sensor 32, a gas path blocking pressure regulation mechanism 5, an online check contact signal sampling unit 6, an intelligent control unit 7, a multichannel joint 9, an air admission interface 10, and a self-sealing valve 11. One end of the self-sealing valve 11 is hermetically connected to an electrical device 8, and the other end of the self-sealing valve 11 is connected to the multichannel joint 9. The second pressure sensor 21, the second temperature sensor 22, the gas path blocking pressure regulation mechanism 5 and the air admission interface 10 are arranged on the multichannel joint 9. The first pressure sensor 21 and the first temperature sensor 31 are arranged on the gas path blocking pressure regulation mechanism 5. The first pressure sensor 21, the second pressure sensor 22, the first temperature sensor 31 and the second temperature sensor 32 are separately connected to the intelligent control unit 7. The first pressure sensor 21, the second pressure sensor 22, and the gas density relay body 1 are in communication with the gas path blocking pressure regulation mechanism 5 in gas paths. The gas path blocking pressure regulation mechanism 5 is connected to the intelligent control unit 7.

Different from the first embodiment, there are two pressure sensors, namely the first pressure sensor 21 and the second pressure sensor 22. There are two temperature sensors, namely the first temperature sensor 31 and the second temperature sensor 32. In this embodiment, a plurality of pressure sensors and a plurality of temperature sensors are provided, such that pressure values monitored by the first pressure sensor 21 and the second pressure sensor 22 may be mutually compared and checked. Temperature values monitored by the first temperature sensor 31 and the second temperature sensor 32 may be mutually compared and checked. Density values $P1_{20}$ monitored by the first pressure sensor 21 and the first temperature sensor 31 and density values $P2_{20}$ monitored by the second pressure sensor 22 and the second temperature sensor 32 are mutually compared and checked. Even density values $Pe_{20}$ of a rated value of the gas density relay body 1 may be acquired by means of online check, and mutually compared and checked, so as to further guarantee reliability of the gas density relay (or the gas density monitoring device), and achieve automatic monitoring and comparison, and maintenance omission.

Moreover, a micro-moisture sensor (not shown in the figure) for monitoring a micro-moisture content of the electrical device 8, and a decomposition product sensor (not shown in the figure) for monitoring a decomposition product content may be further included.

Moreover, the technical product of the present disclosure may also have a safety protection function. Specifically, 1) when the density value monitored by the first pressure sensor 21 and the first temperature sensor 31 or by the second pressure sensor 22 and the second temperature sensor 32 is lower than a set value, the gas density relay automatically stops check on the gas density relay body 1 and gives a notice signal. For example, when the gas density value of the equipment is less than the set value, no check is performed. Only when the gas density value of the equipment is greater than or equal to (a blocking pressure+ 0.02 MPa), may the check be performed. There is state indication for a contact alarm. 2) Alternatively, during check, the valve is closed, and when the density value monitored by the second pressure sensor 22 and the second temperature sensor 32 is lower than the set value, the gas density relay automatically stops check on the gas density relay body 1 and gives a notice signal (gas leakage). For example, when the gas density value of the equipment is less than the set value (the blocking pressure+0.02 MPa), check is not performed any more. The set value may be arbitrarily set as required. In addition, the gas density relay further achieves mutual check on the plurality of pressure sensors and the plurality of temperature sensors, and mutual check on the sensors and the gas density relay, so as to guarantee that the gas density relay operates normally. That is, the pressure values monitored by the first pressure sensor 21 and the second pressure sensor 22 are mutually compared and checked. The temperature values monitored by the first temperature sensor 31 and the second temperature sensor 32 are mutually compared and checked. The density values $P1_{20}$ monitored by the first pressure sensor 21 and the first temperature sensor 31 and the density values $P2_{20}$ monitored by the second pressure sensor 22 and the second temperature sensor 32 are mutually compared and checked. Even the density values $Pe_{20}$ of the rated value of the gas density relay body 1 may be acquired by means of check, and mutually compared and checked.

To sum up, the present disclosure provides the gas density relay having an online self-check function and a check method therefor, as well as a method for modifying the gas density relay. The gas density relay is composed of a gas path (optionally, in the form of a pipeline) connecting portion, a pressure regulating portion, a signal measuring and controlling portion, etc. A main function is to online check and measure the contact value (a pressure value during alarm/locking action) of the gas density relay body, and automatically convert the value into the corresponding pressure value at 20° C., so as to online test the performance of the contact (alarm and blocking) value of the gas density relay. The gas density relay body, the pressure sensor, the temperature sensor, the gas path blocking pressure regulation mechanism, the online check contact signal sampling unit and the intelligent control unit may be flexibly combined in mounting positions. For example, the gas density relay body, the pressure sensor, the temperature sensor, the online check contact signal sampling unit and the intelligent control unit may be combined and designed integrally or split, may be mounted on the housing or the multichannel joint or connected together by means of a connecting pipe. The valve may be directly connected to the electrical device, or may be connected by means of the self-sealing valve or a gas pipe. The pressure sensor, the temperature sensor, the online check contact signal sampling unit and the intelligent control unit may be combined and designed integrally. The pressure sensor and the temperature sensor may be combined and designed integrally. The online check contact signal sampling unit and the intelligent control unit may be combined and designed integrally. In short, the structure is not limited to one type.

The gas density relay having an online self-check function generally means that its elements are designed into an integrated structure. The gas density monitoring device generally means that its elements are designed in a split structure and flexibly combined.

The gas density relay having an online self-check function may have different error determination requirements when checking the density relay contact at the high temperature, the low temperature, the normal temperature and 20° C. ambient temperature, to which, relevant standards may be applied according to the temperature requirements. The error performance of the density relay may be compared according to different temperatures and at different time periods. That is, through comparison in different periods and within the same temperature range, the performance of the density relay may be determined. The comparison may be performed between various historical periods, and between the history and the present. The density relay body may be further checked. When necessary, the contact signal of the density relay may be checked at any time. Whether the gas density relay body and the gas density of the monitored electrical device are normal may be determined. That is, whether the density value of the electrical device, the gas density relay body, the pressure sensor and the temperature sensor are normal may be determined, analyzed and determined, so as to monitor the gas density of the electrical device, and determine, compare and analyze the state of the gas density relay body, etc. A state of the contact signal of the gas density relay may be further monitored and transmitted remotely. The state, including a disconnected or closed state, of the contact signal of the gas density relay may be known from the background, so as to provide additional monitoring and improve the reliability. The temperature compensation performance of the gas density relay body may be further detected, or detected and determined. A contact resistance of the contact of the gas density relay body may be further detected, or detected and determined. Insulation performance of the gas density relay body may be further detected, or detected and determined.

The present disclosure is compact and reasonable in structure, all parts have desirable anti-rust and anti-shock capacity, and mounting is firm and use is reliable. All pipelines of the gas density relay are easy to connect, assemble and disassemble, and the equipment and the parts are convenient to maintain. According to the present disclosure, the check work by the gas density relay may be completed without maintenance personnel on site, such that the reliability of the power grid is greatly improved and the efficiency is improved while the cost is lowered. Moreover, the whole check process achieves zero emission of the SF6 gas, meeting the requirements of environmental protection regulations. Especially, no electronic control valve is required to be used in the present disclosure, such that the sealing performance is better, the size is smaller, field reconstruction is convenient, the reliability is improved, and application and popularization are facilitated.

The specific embodiments of the present disclosure are described in detail above, but they are merely examples, and the present disclosure is not limited to the specific embodiments described above. For those skilled in the art, any equivalent modification and substitution of the present disclosure shall fall within the scope of the present disclosure. Therefore, equivalent changes and modifications made with-

What is claimed is:

1. A gas density relay having an online self-check function, comprising:
a gas density relay body, a gas density detection sensor, a gas path blocking pressure regulation mechanism, an online check contact signal sampling unit and an intelligent control unit; wherein
the gas density detection sensor is in communication with the gas density relay body;
a gas path of the gas density relay body is connected to a first interface of the gas path blocking pressure regulation mechanism;
the gas path blocking pressure regulation mechanism is further provided with a second interface in communication with electrical device, and the gas path blocking pressure regulation mechanism is configured to block a gas path between the first interface and the second interface, and to regulate a pressure rise and fall of the gas density relay body, thereby generating contact signal action of the gas density relay body;
the online check contact signal sampling unit is directly or indirectly connected to the gas density relay body and is configured to sample a contact signal of the gas density relay body; and
the intelligent control unit is separately connected to the gas density detection sensor, the gas path blocking pressure regulation mechanism and the online check contact signal sampling unit, and is configured to at least one of control the gas path blocking pressure regulation mechanism, collect a pressure value and a temperature value, collect a gas density value, and detect a contact signal action value, a contact signal return value of the gas density relay body; wherein
the contact signal comprises at least one of an alarm signal, a blocking signal.

2. The gas density relay having an online self-check function according to claim 1, wherein at least one of:
the gas density detection sensor, the online check contact signal sampling unit and the intelligent control unit are arranged on the gas density relay body;
the gas density detection sensor, the online check contact signal sampling unit and the intelligent control unit are arranged on the gas path blocking pressure regulation mechanism, and the gas path blocking pressure regulation mechanism is arranged on the gas density relay body;
the gas density detection sensor, the gas path blocking pressure regulation mechanism, the online check contact signal sampling unit and the intelligent control unit are arranged on the gas density relay body;
the gas density detection sensor is arranged on the gas density relay body; alternatively, the gas density detection sensor is arranged on the gas path blocking pressure regulation mechanism;
the gas density relay body is arranged on the gas path blocking pressure regulation mechanism; and
the online check contact signal sampling unit and the intelligent control unit are arranged on the gas path blocking pressure regulation mechanism.

3. The gas density relay having an online self-check function according to claim 1, wherein the gas density detection sensor comprises at least one pressure sensor and at least one temperature sensor, the pressure sensor is mounted on the gas path of the gas density relay body or the gas path blocking pressure regulation mechanism, and the temperature sensor is mounted on or outside the gas path of the gas density relay body, or in the gas density relay body, or outside the gas density relay body; the gas density detection sensor is a gas density transmitter composed of a pressure sensor and a temperature sensor; and the gas density detection sensor is a density detection sensor using quartz tuning fork technology.

4. The gas density relay having an online self-check function according to claim 1, wherein at least one of:
the intelligent control unit acquires the gas density value collected by the gas density detection sensor;
the intelligent control unit acquires the pressure value and the temperature value collected by the gas density detection sensor, and completes online monitoring of a gas density of the monitored electrical device by means of the gas density relay.

5. The gas density relay having an online self-check function according to claim 1, wherein at least one of:
the intelligent control unit acquires a gas density value, during contact signal action or switching of the gas density relay body, collected by the gas density detection sensor, and completes online check on the gas density relay; and
the intelligent control unit acquires a pressure value and a temperature value, during contact signal action or switching of the gas density relay body, collected by the gas density detection sensor, and converts the pressure value and the temperature value into a corresponding pressure value at 20° C. according to a gas pressure-temperature feature, that is, the gas density value, so as to complete online check on the gas density relay.

6. The gas density relay having an online self-check function according to claim 1, wherein the gas path blocking pressure regulation mechanism comprises a sealed cavity and a blocking member in the sealed cavity, the first interface and the second interface are both provided on a wall of the sealed cavity and are in communication with an internal space of the sealed cavity, the blocking member is configured to block the gas path between the first interface and the second interface, and to regulate the pressure rise and fall of the gas density relay body, generating the contact signal action of the gas density relay body.

7. The gas density relay having an online self-check function according to claim 6, wherein an edge of the blocking member is in sealing contact with an inner wall of the sealed cavity, and the blocking member comprises one of a piston and a sealing blocking member.

8. The gas density relay having an online self-check function according to claim 7, wherein one end of the sealed cavity is provided with a fifth interface, one end of the connector is connected to the blocking member, and the other end of the connector passes through the fifth interface to be connected to the drive part; and the first interface is closer to the fifth interface than the second interface, and alternatively, the first interface is farther away from the fifth interface than the second interface.

9. The gas density relay having an online self-check function according to claim 8, wherein the gas path blocking pressure regulation mechanism further comprises a seal connector, the seal connector is arranged at the fifth interface of the sealed cavity, and the other end of the connector passes through the seal connector to be connected to the drive part; and the seal connector comprises one of a bellows, an airbag and a seal ring.

10. The gas density relay having an online self-check function according to claim 6, wherein the sealed cavity is a retractable cavity, the drive part is located in the sealed cavity and is provided with drive ends in two directions, connectors comprise a first connector and a second connector which are connected to the drive ends in two directions respectively, the other end of the first connector is connected to an inner wall of the sealed cavity, the other end of the second connector is connected to the blocking member, the blocking member is provided with a via hole for communication between an interior of the sealed cavity and the second interface, and one side, facing the second interface, of the blocking member is provided with a seal, and the seal is arranged around the via hole; and the two drive ends face opposite directions.

11. The gas density relay having an online self-check function according to claim 1, wherein the online check contact signal sampling unit comprises a breaking and sampling element, the breaking and sampling element is controlled by the gas density relay body or the gas path blocking pressure regulation mechanism or the intelligent control unit; in a non-checking state, the online check contact signal sampling unit breaks the circuit, by means of the breaking and sampling element, relative to the contact of the gas density relay body; in a checking state, the online check contact signal sampling unit breaks a contact signal control loop of the gas density relay body by means of the breaking and sampling element, and connects the contact of the gas density relay body to the intelligent control unit; and the breaking and sampling element comprises one or more of a stroke switch, a microswitch, a button, a motor-operated switch, a displacement switch, an electromagnetic relay, an optocoupler and a silicon controlled rectifier.

12. The gas density relay having an online self-check function according to claim 1, wherein the gas density relay further comprises a valve, and the gas path blocking pressure regulation mechanism is further provided with a third interface; one end of the valve is connected to the third interface of the gas path blocking pressure regulation mechanism, and the other end of the valve is directly or indirectly connected to the electrical device; and the first interface is located between the second interface and the third interface.

13. The gas density relay having an online self-check function according to claim 1, wherein the gas density relay further comprises a temperature regulation mechanism, the temperature regulation mechanism being a temperature regulatable regulation mechanism and being configured to regulate a temperature rise and fall of a temperature compensation element of the gas density relay body, so as to at least one of cooperate with and combine with the gas path blocking pressure regulation mechanism to generate the contact signal action of the gas density relay body, and the intelligent control unit is connected to the temperature regulation mechanism to control the temperature regulation mechanism.

14. The gas density relay having an online self-check function according to claim 1, wherein al least one of:
the gas density relay further comprises a multichannel joint, the gas density relay body and the gas path blocking pressure regulation mechanism are arranged on the multichannel joint,
the gas path blocking pressure regulation mechanism is fixed on the multichannel joint, and alternatively, the gas density relay body, the gas density detection sensor and the gas path blocking pressure regulation mechanism are arranged on the multichannel joint.

15. The gas density relay having an online self-check function according to claim 1, wherein at least one of:

at least two gas density relay bodies, at least two gas path blocking pressure regulation mechanisms, at least two online check contact signal sampling units, one intelligent control unit and one gas density detection sensor complete online check by the gas density relay or a gas density monitoring device;
at least two gas density relay bodies, at least two gas path blocking pressure regulation mechanisms, at least two online check contact signal sampling units, at least two intelligent control units and one gas density detection sensor complete online check by the gas density relay or a gas density monitoring device; and
at least two gas density relay bodies, at least two gas path blocking pressure regulation mechanisms, at least two online check contact signal sampling units, at least two gas density detection sensors and one intelligent control unit complete online check by the gas density relay or a gas density monitoring device.

16. A check method for the gas density relay having an online self-check function according to claim 1, comprising:
monitoring, in a normal operation state by the gas density relay, a gas density value in electrical device; wherein according to set check time or/and a check instruction and the gas density value, in the case where the gas density relay is allowed to be checked:
the gas density relay controls a gas path blocking pressure regulation mechanism by means of an intelligent control unit, a blocking member of the gas path blocking pressure regulation mechanism moves under the action of a drive part, the blocking member blocks a gas path between a first interface and a second interface, along with movement of the blocking member, a volume of a sealed cavity of the gas path blocking pressure regulation mechanism changes, such that a pressure of a gas density relay body can be regulated and further a gas pressure slowly falls, thereby generating contact action of the gas density relay body, the contact action is transmitted to the intelligent control unit by means of an online check contact signal sampling unit, and the intelligent control unit acquires the gas density value according to a pressure value and a temperature value during the contact action, or directly acquires the gas density value, detects a contact signal action value of the gas density relay body, and completes check on the contact signal action value of the gas density relay body; and
the gas density relay controls, after check on all contact signals is completed, the gas path blocking pressure regulation mechanism by means of the intelligent control unit, and the blocking member of the gas path blocking pressure regulation mechanism moves under the action of the drive part, such that the gas path between the first interface and the second interface of the gas path blocking pressure regulation mechanism is connected.

17. The check method for the gas density relay having an online self-check function according to claim 16, comprising:
monitoring, in the normal operation state by the gas density relay, the gas density value in electrical device, and online monitoring, by the gas density relay, the gas density value in electrical device by means of a gas density detection sensor and the intelligent control unit; wherein
according to at least one of the set check time and the check instruction and the gas density value, in the case where the gas density relay is allowed to be checked:

the gas density relay directly or indirectly regulates the online check contact signal sampling unit to a checking state by means of the intelligent control unit, and in the checking state, the online check contact signal sampling unit blocks a contact signal control loop of the gas density relay body, and connects a contact of the gas density relay body to the intelligent control unit;

the gas density relay controls the gas path blocking pressure regulation mechanism by means of the intelligent control unit, the blocking member of the gas path blocking pressure regulation mechanism moves under the action of the drive part, the blocking member blocks the gas path between the first interface and the second interface, along with movement of the blocking member, the volume of the sealed cavity of the gas path blocking pressure regulation mechanism changes, such that the pressure of the gas density relay body can be regulated and further the gas pressure slowly falls, thereby generating the contact action of the gas density relay body, the contact action is transmitted to the intelligent control unit by means of the online check contact signal sampling unit, and the intelligent control unit acquires the gas density value according to the pressure value and the temperature value during the contact action, or directly acquires the gas density-value, detects the contact signal action value of the gas density relay body, and completes check on the contact signal action value of the gas density relay body;

the gas density relay drives, by means of the intelligent control unit, the gas path blocking pressure regulation mechanism to cause the gas pressure to rise slowly, thereby generating contact reset of the gas density relay body, the contact reset is transmitted to the intelligent control unit by means of the online check contact signal sampling unit, and the intelligent control unit acquires the gas density value according to a pressure value and a temperature value during the contact reset, or directly acquires the gas density value, detects a contact signal return value of the gas density relay body, and completes the check on the contact signal return value of the gas density relay body; and the gas density relay controls, after the check on all contact signals is completed, the gas path blocking pressure regulation mechanism by means of the intelligent control unit, the blocking member of the gas path blocking pressure regulation mechanism moves under the action of the drive part, such that the gas path between the first interface and the second interface of the gas path blocking pressure regulation mechanism is connected, the online check contact signal sampling unit is regulated to an operation state, and the contact signal control loop of the gas density relay body is restored to a normal operation state.

18. The check method for the gas density relay having an online self-check function according to claim 16, wherein the gas density relay further comprises a temperature regulation mechanism, and the temperature regulation mechanism is a temperature regulatable regulation mechanism; the method comprises:

monitoring, in the normal operation state by the gas density relay, the gas density value in electrical device, and online monitoring, by the gas density relay, the gas density value in electrical device by means of a gas density detection sensor and the intelligent control unit; and according to at least one of the set check time and the check instruction and the gas density value, in the case where the gas density relay is allowed to be checked:

the gas density relay directly or indirectly regulates the online check contact signal sampling unit to a checking state by means of the intelligent control unit, and in the checking state, the online check contact signal sampling unit blocks a contact signal control loop of the gas density relay body, and connects a contact of the gas density relay body to the intelligent control unit;

the gas density relay controls the gas path blocking pressure regulation mechanism by means of the intelligent control unit, the blocking member of the gas path blocking pressure regulation mechanism moves under the action of the drive part, the blocking member blocks the gas path between the first interface and the second interface, along with movement of the blocking member, the volume of the sealed cavity of the gas path blocking pressure regulation mechanism changes, such that the pressure of the gas density relay body can be regulated and further the gas pressure slowly falls, the intelligent control unit controls the temperature regulation mechanism, such that a temperature of a temperature compensation element of the gas density relay body rises, thereby generating the contact action of the gas density relay body, the contact action is transmitted to the intelligent control unit by means of the online check contact signal sampling unit, and the intelligent control unit acquires the gas density value according to the pressure value and the temperature value during the contact action, or directly acquires the gas density value, detects the contact signal action value of the gas density relay body, and completes the check on the contact signal action value of the gas density relay body;

the gas density relay drives the gas path blocking pressure regulation mechanism by means of the intelligent control unit, such that the gas pressure slowly rises, the intelligent control unit controls the temperature regulation mechanism, such that the temperature of the temperature compensation element of the gas density relay body falls, thereby generating contact reset of the gas density relay body, the contact reset is transmitted to the intelligent control unit by means of the online check contact signal sampling unit, and the intelligent control unit acquires the gas density value according to the pressure value and the temperature value during the contact reset, or directly acquires the gas density value, detects the contact signal return value of the gas density relay body, and completes the check on the contact signal return value of the gas density relay body; and the gas density relay controls, after the check on all contact signals is completed, the gas path blocking pressure regulation mechanism by means of the intelligent control unit, the blocking member of the gas path blocking pressure regulation mechanism moves under the action of the drive part, such that the gas path between the first interface and the second interface of the gas path blocking pressure regulation mechanism is connected, the intelligent control unit turns off a heating element of the temperature regulation mechanism, the online check contact signal sampling unit is regulated to an operation state, and the contact signal control loop of the gas density relay body is restored to a normal operation state.

19. A method for modifying the gas density relay according to claim 1, comprising:

causing a gas density detection sensor to be in communication with a gas density relay body;

connecting a gas path of the gas density relay body to a first interface of a gas path blocking pressure regulation mechanism, wherein the gas path blocking pressure regulation mechanism is further provided with a second interface in communication with electrical device, and the gas path blocking pressure regulation mechanism is configured to block a gas path between the first interface and the second interface, and to regulate a pressure rise and fall of the gas density relay body, thereby generating contact signal action of the gas density relay body;

directly or indirectly connecting an online check contact signal sampling unit to the gas density relay body, wherein the online check contact signal sampling unit is configured to sample a contact signal of the gas density relay body; and connecting an intelligent control unit to the gas density detection sensor, the gas path blocking pressure regulation mechanism and the online check contact signal sampling unit separately, so as to at least one of control the gas path blocking pressure regulation mechanism, collect a pressure value and a temperature value, and collect a gas density value, and detect a contact signal action value and a contact signal return value of the gas density relay body;

wherein the contact signal comprises at least one of an alarm signal and a blocking signal.

20. The method for modifying the gas density relay according to claim 19, further comprising:

arranging a temperature regulation mechanism inside or outside a housing of the gas density relay body, wherein the temperature regulation mechanism is a temperature regulatable regulation mechanism and is configured to regulate a temperature rise and fall of a temperature compensation element of the gas density relay body, so as to at least one of cooperate with and combine with the gas path blocking pressure regulation mechanism to generate the contact signal action of the gas density relay body; and connecting the intelligent control unit to the temperature regulation mechanism to control the temperature regulation mechanism.

* * * * *